United States Patent
Yabe et al.

(10) Patent No.: US 6,411,169 B1
(45) Date of Patent: *Jun. 25, 2002

(54) OSCILLATION CIRCUIT, ELECTRONIC CIRCUIT USING THE SAME, AND SEMICONDUCTOR DEVICE, ELECTRONIC EQUIPMENT, AND TIMEPIECE USING THE SAME

(75) Inventors: Hiroshi Yabe, Shiojiri; Shinji Nakamiya, Matsumoto; Tadao Kadowaki; Yoshiki Makiuchi, both of Chino, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/631,697

(22) Filed: Aug. 3, 2000

Related U.S. Application Data

(63) Continuation-in-part of application No. 09/516,559, filed on Feb. 29, 2000, now abandoned, which is a continuation of application No. 08/994,020, filed on Dec. 18, 1997, now Pat. No. 6,046,648.

(30) Foreign Application Priority Data

Dec. 27, 1996 (JP) ............................................. 8-359013
Mar. 19, 1997 (JP) ............................................. 9-87763
Jun. 19, 2000 (JP) ...................................... 2000-183384

(51) Int. Cl.[7] .............................................. H03B 5/36
(52) U.S. Cl. ............................... 331/116 FE; 331/158; 331/185
(58) Field of Search ........................... 331/116 FS, 158, 331/185

(56) References Cited

U.S. PATENT DOCUMENTS

| | | | |
|---|---|---|---|
| 3,887,881 A | 6/1975 | Hoffmann | 331/116 R X |
| 4,095,195 A | 6/1978 | Saito | 331/116 R |
| 4,346,350 A | 8/1982 | Morokawa et al. | 331/116 FE |
| 4,352,073 A | 9/1982 | Leuthold | 330/264 |
| 4,405,906 A | 9/1983 | Luscher | 331/116 FE |
| 4,459,565 A | 7/1984 | Leach | 331/116 FE |
| 5,491,429 A | 2/1996 | Gasparik | 326/27 |
| 6,046,648 A * | 4/2000 | Nakamiya et al. | 331/116 FE |

FOREIGN PATENT DOCUMENTS

| | | |
|---|---|---|
| JP | 10-197667 | 7/1998 |
| JP | 10-260275 | 9/1998 |

* cited by examiner

*Primary Examiner*—Arnold Kinkead
(74) *Attorney, Agent, or Firm*—Oliff & Berridge, PLC

(57) ABSTRACT

This invention relates to a crystal oscillation circuit that oscillates stably with a low power consumption. This crystal oscillation circuit comprises an inverting amplifier, a crystal oscillator, and a feedback circuit that inverts the phase of an output from this inverting amplifier and feeds it back as an input. The sum of the absolute value of the threshold voltage of a first semiconductor switching element and the absolute value of the threshold voltage of a second semiconductor switching element is set to be greater than or equal to the absolute value of the potential difference between first and second potentials, when said inverting amplifier includes the first and second semiconductor switching elements.

45 Claims, 20 Drawing Sheets

$|V_{reg}| > |V_{TP}| + |V_{TN}|$ $|V_{reg}| \leq |V_{TP}| + |V_{TN}|$

OSCILLATION CIRCUIT, ELECTRONIC CIRCUIT USING THE SAME, AND SEMICONDUCTOR DEVICE, ELECTRONIC EQUIPMENT, AND TIMEPIECE USING THE SAME

This is a Continuation-in-Part of application Ser. No. 09/516,559 filed on Feb. 29, 2000, now abandon which in turn is a continuation of U.S. Ser. No. 08/994,020 now U.S. Pat. No. 6,046,648 filed Dec. 18, 1997. The entire disclosures of the prior applications are hereby incorporated by reference in their entirety.

BACKGROUND OF THE INVENTION

1. Field of the Invention

This invention relates to an oscillation circuit, an electronic circuit using that oscillation circuit, and a semiconductor device, electronic equipment, and timepiece using that oscillation circuit or electronic circuit.

2. Description of the Related Art

Oscillation circuits that use crystal oscillators are widely employed in the art in devices such as portable timepieces, portable telephones, and computer terminals. It is necessary to design such portable items of electronic equipment in such a manner that they are economical in their power consumption and have longer battery lives.

This crystal oscillation circuit comprises an inverting amplifier and a feedback circuit that is provided with a crystal oscillator. The inverting amplifier comprises a pair of transistors where the gate of each of these transistors is used as an input side and the drain thereof is used as an output side, by way of example. In this case, the drain sides of these two transistors are connected together and the source sides thereof are connected to ground and a power voltage side, respectively.

If the power voltage is applied to the inverting amplifier in the crystal oscillation circuit of this configuration, the phase of the output of the inverting amplifier is inverted through 180 degrees and the thus inverted signal is fed back to the gate of each transistor as an input. The transistors configuring the inverting amplifier are turned on and off alternately by the operation of this feedback, the oscillation output of the crystal oscillation circuit gradually increases, and thus the oscillator starts to oscillate stably.

However, the absolute value of a voltage $V_{reg}$ applied to the inverting amplifier in this prior-art crystal oscillation circuit is set to be greater than the total of the absolute values of the threshold voltages $V_{TP}$ and $V_{TN}$ of the transistors in this circuit, as follows:

$$|V_{reg}| > |V_{TP}| + |V_{TN}| \quad (1)$$

The current inventors have discovered that this is the cause of a short-circuiting current $I_S$ that flows from the high potential side to the low potential side within the inverting amplifier, which causes a problem when trying to reduce the power consumption of the entire circuit.

SUMMARY OF THE INVENTION

An objective of this invention is to reduce the above short-circuiting current that flows through the inverting amplifier and thus provide an oscillation circuit that can oscillate with a low power consumption, an electronic circuit that uses such an oscillation circuit, and a semiconductor device, electronic equipment, and timepiece that use this oscillation circuit or electronic circuit.

In order to achieve the above objective, an oscillation circuit in accordance with a first aspect of this invention comprises an inverting amplifier including a first semiconductor switching element and a second semiconductor switching element;

wherein the first and second semiconductor switching elements are prevented from being on simultaneously to limit a short-circuiting current flowing through the inverting amplifier when the first and second semiconductor switching element is driven.

This configuration makes it possible to limit the short-circuiting current flowing through the inverting amplifier, making it possible to provide an oscillation circuit that can oscillate with a low power consumption.

The sum of the absolute value of the threshold voltage of the first semiconductor switching element and the absolute value of the threshold voltage of the second semiconductor switching element may be set to be greater than or equal to the absolute value of the power voltage of the inverting amplifier, to limit a short-circuiting current flowing through the inverting amplifier.

The oscillation circuit of this invention may further comprise a feedback circuit having a crystal oscillator connected between the output and input sides of the inverting amplifier, for causing the phase of an output signal from the inverting amplifier to invert and feeding the thus inverted signal back to the inverting amplifier as an input;

wherein the inverting amplifier comprises a first circuit including the first semiconductor switching element, and a second circuit including the second semiconductor switching element;

wherein the first semiconductor switching element is connected to the side of a first potential and is driven to be turned on and off by the feedback input, to excite the crystal oscillator;

wherein the second semiconductor switching element is connected to the side of a second potential that differs from the first potential and is driven to be turned on and off by the feedback input at a timing that differs from that of the first semiconductor switching element, to excite the crystal oscillator; and wherein the sum of the absolute value of the threshold voltage of the first semiconductor switching element and the absolute value of the threshold voltage of the second semiconductor switching element is set to be greater than or equal to the absolute value of the power voltage of the inverting amplifier, to limit a short-circuiting current flowing through the inverting amplifier.

In this case, when a voltage is applied to the inverting amplifier in the crystal oscillation circuit, excitation of the crystal oscillator starts. The phase of the output of the inverting amplifier is inverted by the feedback circuit and is fed back as an input. The operations of inverting, amplifying, and outputting this feedback input signal by the inverting amplifier are repeated.

During this time, the first and second semiconductor switching elements that configure the inverting amplifier are driven to be turned on and off at mutually different timings by this feedback input, to excite the crystal oscillator.

As stated above, the sum of the absolute values of the threshold voltages of the first and second semiconductor switching elements can be set to be greater than or equal to the absolute value of the power voltage of the inverting amplifier. This prevents the first and second semiconductor switching elements from being driven to turn on simultaneously when the circuit is operating, and, as a result, the short-circuiting current flowing through the inverting amplifier can be greatly reduced, making it possible to reduce the power consumption.

In particular, by forming the first and second transistors in such a manner that the threshold voltage conditions are satisfied, there is no further need for means for dealing with this short-circuiting current, making it unnecessary to use special circuit components for counteracting this short-circuiting current. This makes it possible to reduce the power consumption of the crystal oscillation circuit without adversely affecting the degree of integration of the entire circuit.

Note that it is necessary to set each of the absolute values of the threshold voltages of these first and second semiconductor switching elements to be less than the absolute value of the power voltage of the inverting amplifier.

The oscillation circuit may further comprise a bias circuit for applying a first direct current bias voltage and a second direct current bias voltage to gates of the first semiconductor switching element and the second semiconductor switching element, respectively;

wherein the first and second direct current bias voltages shift the values of the direct current potentials of feedback inputs that are input from the inverting amplifier to the gates of the first and second semiconductor switching elements, to prevent the first and second semiconductor switching elements from being on simultaneously.

The oscillation circuit may further comprise:

a feedback circuit having a crystal oscillator connected between the output and input sides of the inverting amplifier, for causing the phase of an output signal from the inverting amplifier to invert and feeding the thus inverted signal back to the inverting amplifier as an input; and a bias circuit for applying a direct current bias voltage to the inverting amplifier;

wherein the inverting amplifier comprises:

a first circuit connected to the side of a first potential and comprising the first semiconductor switching element; and a second circuit connected to the side of a second potential that differs from the first potential and comprising the second semiconductor switching element;

wherein the first semiconductor switching element is connected to the side of the first potential and is driven to be turned on and off by the feedback input that is input to a gate, to excite the crystal oscillator;

wherein the second semiconductor switching element is connected to the side of the second potential and is driven to be turned on and off by the feedback input that is input to a gate at a timing that differs from that of the first semiconductor switching element, to excite the crystal oscillator;

wherein the bias circuit comprises:

a first bias circuit for applying a first direct current bias voltage to the gate of the first semiconductor switching element; and a second bias circuit for applying a second direct current bias voltage to the gate of the second semiconductor switching element; and wherein the first and second direct current bias voltages shift the values of the direct current potentials of feedback inputs that are input from the inverting amplifier to the gates of the first and second semiconductor switching elements, to prevent the first and second semiconductor switching elements from being on simultaneously.

By employing the above configuration, there is no common-on time at which both of the first and second semiconductor switching elements are on, while the first and second semiconductor switching elements that configure the inverting amplifier are driven to be turned on and off at mutually different timings by this feedback input, to excite the crystal oscillator. Therefore the short-circuiting current flowing through the inverting amplifier can be greatly reduced, making it possible to achieve a crystal oscillation circuit that can oscillate stably at a low power consumption.

In particular, the short-circuiting current of the inverting amplifier can be reduced, even when the absolute values of the threshold voltages of the first and second semiconductor switching elements are made small. The power voltage of the crystal oscillation circuit can therefore be reduced by that amount, making it possible to reduce the power consumption of the oscillation circuit even further.

In this case, the first direct current bias voltage may be set to the first potential and the second direct current bias voltage may be set to the second potential.

The direct current potentials of the inputs fed back to the gates of the first and second semiconductor switching elements can be shifted towards the respective first and second potential sides of the power source by the application of the thus-set direct current bias voltages. This makes it possible to provide a crystal oscillation circuit which has a simple circuit configuration and which can reduce the short-circuiting current of the inverting amplifier.

The first and second semiconductor switching elements may be configured by using field-effect transistor elements of differing conductivity types.

According to a second aspect of this invention, there is provided an electronic circuit comprising the above oscillation circuit of this invention.

Similarly, according to a third aspect of this invention, there is provided a semiconductor device comprising one of the above oscillation circuit and the electronic circuit of this invention.

Furthermore, according to a fourth aspect of this invention, there is provided electronic equipment comprising one of the above oscillation circuit and the electronic circuit of this invention.

This can reduce the power consumption of an item of portable electronic equipment, such as a portable telephone or computer terminal, and thus makes it possible to reduce the consumption thereof of power from an internal battery or secondary battery.

Finally, according to a fifth aspect of this invention, there is provided a timepiece comprising one of the above oscillation circuit and the electronic circuit of this invention.

This makes it possible to implement a portable timepiece that has a low power consumption, which enables the design of a timepiece that is itself smaller and uses an even smaller battery. Alternatively, the battery life thereof could be extended even when a battery of the same capacity is used.

BRIEF DESCRIPTION OF THE DRAWINGS

FIG. 26A is a block diagram of the selection signal forming circuit while

DESCRIPTION OF PREFERRED EMBODIMENTS

Preferred embodiments of this invention will be described below with reference to the accompanying drawings.

First Embodiment

Figure 1:
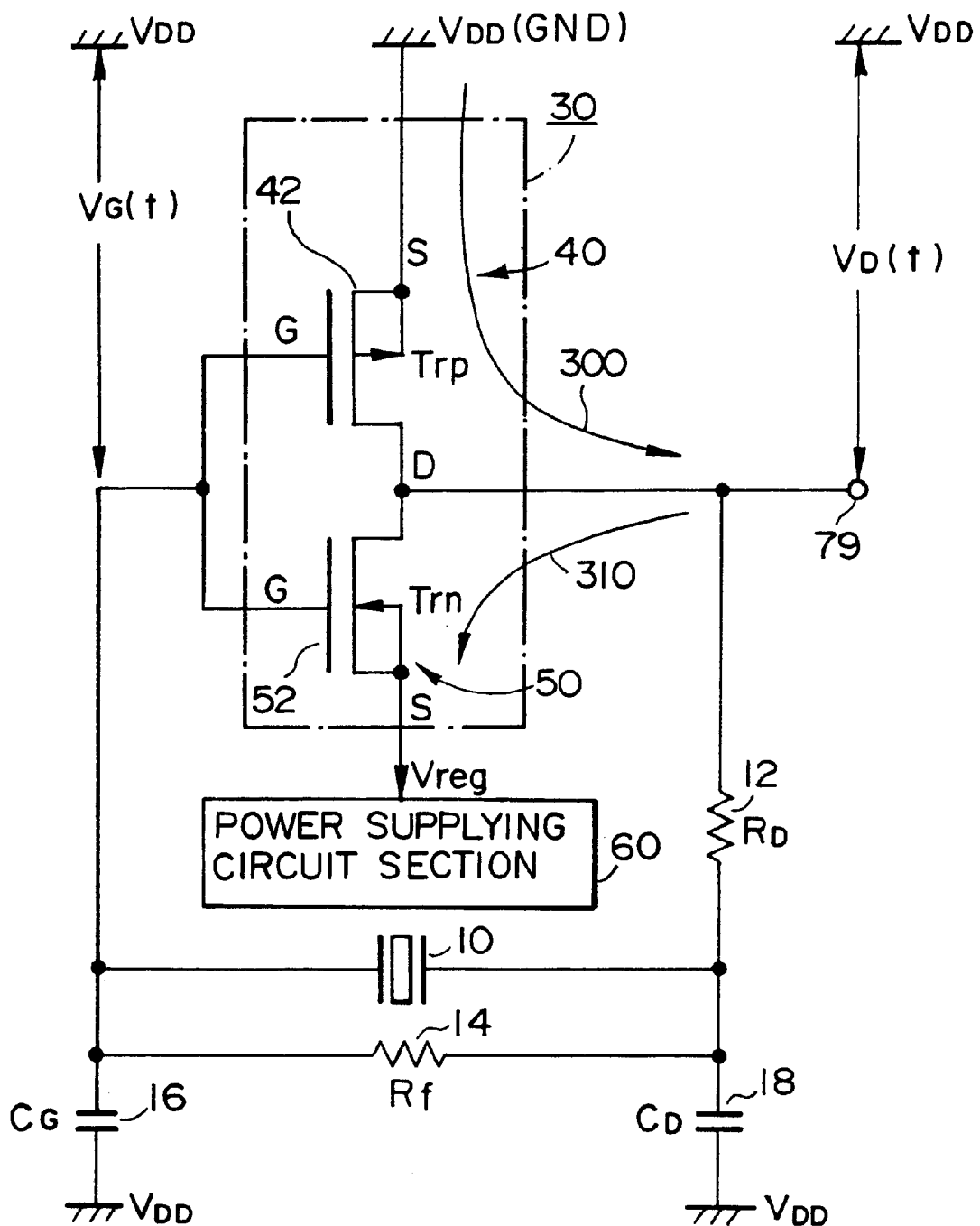
FIG. 1 is a circuit diagram of a first embodiment of the crystal oscillation circuit in accordance with this invention.

A crystal oscillation circuit relating to a first embodiment of this invention is shown in FIG. 1. The crystal oscillation circuit of this embodiment is one that is used in a quartz wristwatch.

This crystal oscillation circuit comprises an inverting amplifier 30 and a feedback circuit. This feedback circuit comprises a crystal oscillator 10, a resistor 14, and phase-compensation capacitors 16 and 18. It inverts the phase of an output $V_{D(t)}$ of the inverting amplifier 30 by 180 degrees and inputs the inverted signal as a gate signal $V_{G(t)}$ to the gate of the inverting amplifier 30 as feedback.

The configuration of the inverting amplifier 30 is such that it is connected between a first potential side and a second potential side that is at a lower potential, and it is powered by the potential difference between these two potentials. In this particular case, the first potential is set to the ground potential $V_{DD}$ and the second potential is set to a negative power source potential $V_{reg}$ that is supplied from a power supplying circuit section 60.

The inverting amplifier 30 comprises a first circuit 40 and a second circuit 50.

The first circuit 40 comprises a p-type field-effect transistor 42 that functions as a first semiconductor switching element. The source of this transistor 42 is connected to ground, the drain thereof is connected to an output terminal 79 side, and the feedback signal $V_{G(t)}$ is applied to the gate thereof.

The second circuit 50 comprises an n-type field-effect transistor 52 that functions as a second semiconductor switching element. The source of this transistor 52 is connected to the power source terminal side of the power supplying circuit section 60, the drain thereof is connected to the output terminal 79 side (in this case, it is actually connected to the drain of the transistor 42), and the feedback signal $V_{G(t)}$ is applied to the gate thereof.

A transistor that is both a p-type as well as an enhancement-mode field-effect transistor is used as the transistor 42, and a transistor that is both an n-type as well as an enhancement-mode field-effect transistor is used as the transistor 52. The values of the threshold voltage $V_{TP}$ of the transistor 42 and the threshold voltage $V_{TN}$ of the transistor 52 are such that the total absolute value thereof is greater than or equal to the absolute value of the power voltage applied to the inverting amplifier 30 (in this embodiment, the power voltage is $V_{reg}$, which is the potential difference between the ground potential and the power source potential, because the ground potential $V_{DD}$ is set to zero), as given by the following equation:

$$|V_{reg}| \leq |V_{TP}| + |V_{TN}| \qquad (2)$$

In addition, the absolute values of the threshold voltages of the transistors 42 and 52 are each set to be less than the absolute value of the power voltage, as follows:

$$|V_{reg}| > |V_{TP}|$$

$$|V_{reg}| > |V_{TN}| \qquad (3)$$

This ensures that the short-circuiting current that flows through the inverting amplifier 30 of the crystal oscillation circuit of this embodiment is greatly reduced, making it possible to reduce the power consumption thereof.

The reasons for this are discussed below.

Figure 2:
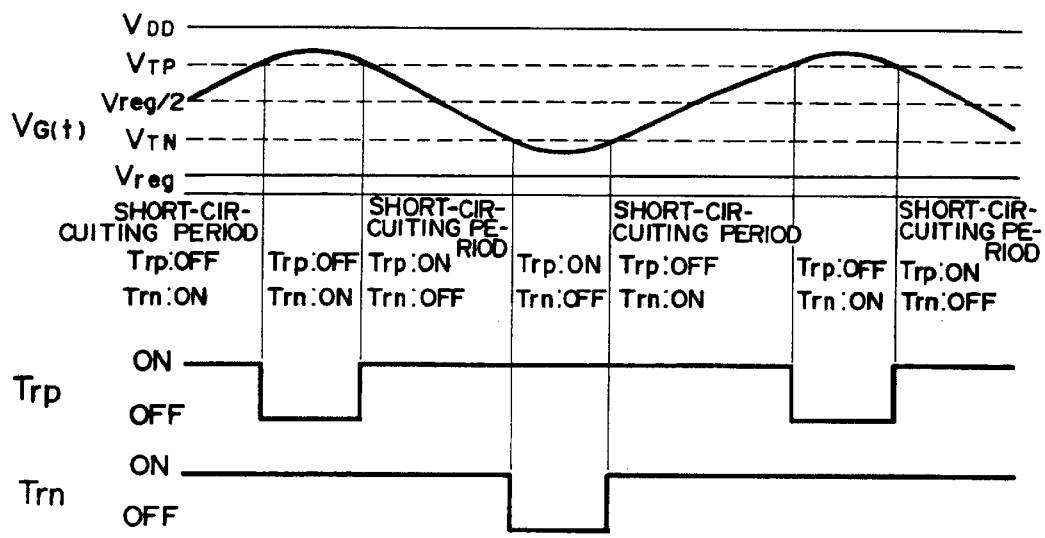
FIG. 2 is a timing chart of a prior-art circuit.
Figure 3:
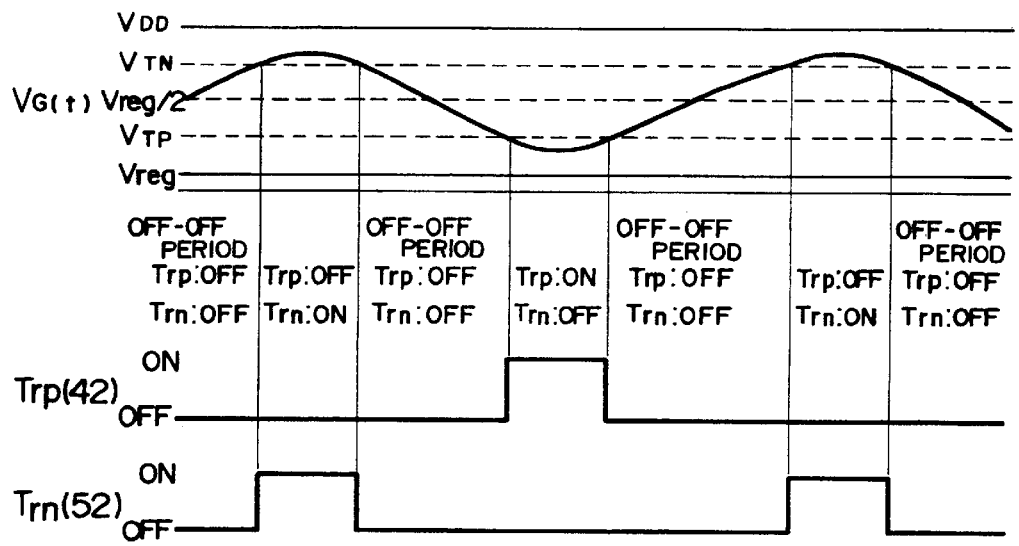
FIG. 3 is a timing chart of the circuit of FIG. 1.

A timing chart of a prior-art crystal oscillation circuit is shown in FIG. 2 and a timing chart of the crystal oscillation circuit of this embodiment is shown in FIG. 3. In each of these figures, the elapsed time from the application of the power voltage $V_{reg}$ from the power supplying circuit section 60 is plotted along the horizontal axis, with the feedback input $V_{G(t)}$ to the inverting amplifier 30 and the on/off state of the transistors 42 and 52 being plotted along the vertical axis.

Figure 4:
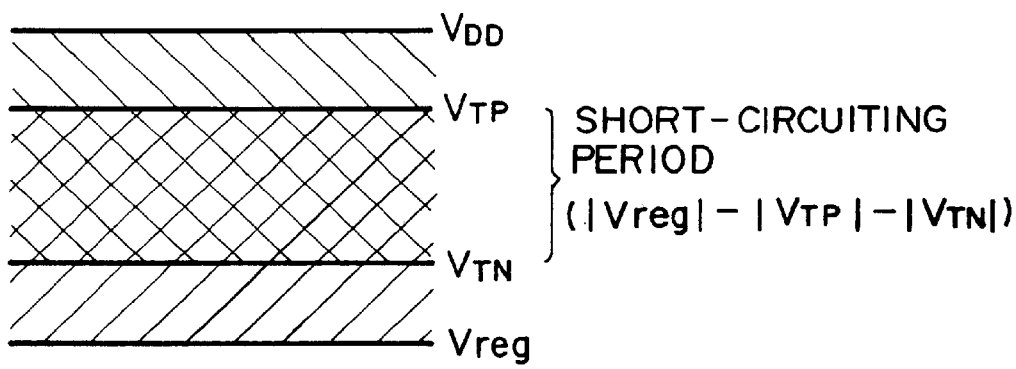
FIG. 4 is a illustrative drawing of the relationship between the threshold voltages, the power source potential, and the ground potential of the prior-art circuit.

As previously mentioned, the threshold voltages of the two transistors that configure the inverting amplifier of the prior-art crystal oscillation circuit are set in such a manner that the above Equation (1) is satisfied. The relationships between the threshold voltages of these transistors, the ground potential $V_{DD}$, and the power source potential $V_{reg}$ in this case are shown graphically in FIG. 4. In other words, if the value of the feedback input $V_{G(t)}$ to the inverting amplifier is set to within the following range with respect to the potentials of the threshold voltages $V_{TP}$ and $V_{TN}$:

$$V_{TP} > V_{G(t)} > V_{TN}$$

both transistors are turned on and a short-circuiting period is established thereby.

Therefore, while these transistors are being turned on and off alternately by the feedback signal $V_{G(t)}$, a time during which both of the transistors are driven to be on occurs periodically, as shown in FIG. 2, so that a short-circuiting current flows from the high potential ($V_{DD}$) to the low potential ($V_{reg}$) side, which is an impediment to any reduction in the power consumption.

Figure 5:
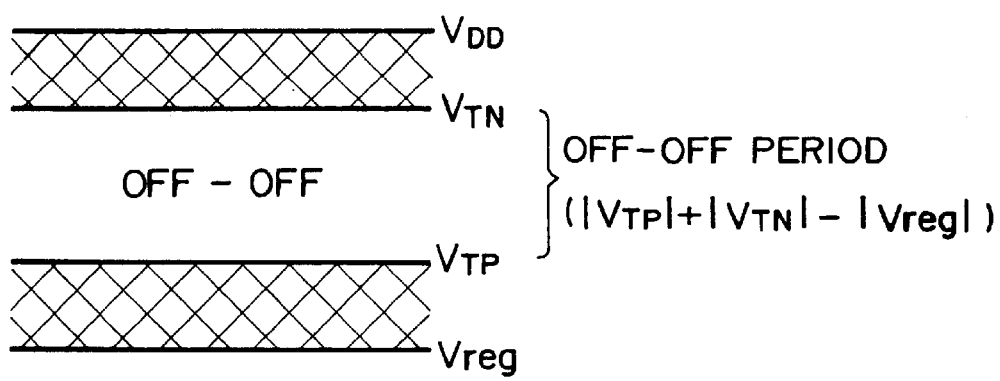
FIG. 5 is a illustrative drawing of the relationship between the threshold voltages, the power source potential, and the ground potential of the first embodiment.

In contrast thereto, the threshold voltages of the transistors 42 and 52 in this embodiment are set in such a manner that the above Equations (2) and (3) are satisfied. The relationships between the threshold voltages, the ground potential $V_{DD}$, and the power source potential $V_{reg}$ in this case are shown in FIG. 5. That is to say, if the value of the feedback input $V_{G(t)}$ to the inverting amplifier 30 is set to be within the following range with respect to the potentials of the threshold voltages $V_{TP}$ and $V_{TN}$:

$$V_{TN} > V_{G(t)} > V_{TP}$$

the two transistors 42 and 52 are turned firmly off so that there is no common-on time during which both of the transistors 42 and 52 are on, as there is in the prior art.

In other words, as shown in FIG. 3, while the transistors 42 and 52 are being driven on and off alternately by the feedback signal $V_{G(t)}$, there is no period of time during which both of the transistors 42 and 52 are on, so that the short-circuiting current that causes problems in the prior art is greatly reduced and thus the power consumption of the crystal oscillation circuit can be reduced.

In particular, this method of countering the short-circuiting current of the inverting amplifier 30 of this embodiment can be implemented without increasing the number of circuit components.

Furthermore, the absolute values of the threshold voltages of the transistors 42 and 52 of this embodiment are each set to be less than the absolute value of the power voltage $V_{reg}$, as shown by Equations (3). This makes it possible to implement a reduced power consumption while maintaining a stable oscillation of the crystal oscillation circuit.

In other words, the absolute value of the amplitude of the feedback signal $V_{G(t)}$ of the inverting amplifier 30 in the crystal oscillation circuit does not exceed the absolute value of the power voltage $V_{reg}$ of the inverting amplifier. This means that the transistors 42 and 52 can be driven to turn on and off alternately in a stable manner by setting the absolute values of the threshold voltages of the transistors 42 and 52 to satisfy Equations (3).

Experiments performed by the present inventors have verified that a satisfactory oscillation state can be maintained and the power consumption can be reduced when an oscillation circuit is driven by a power voltage $V_{reg}$ of an absolute value of 0.9 volts, even when the sum of the absolute values of the threshold voltages of the transistors 42 and 52 varies within the following range:

$$1.4 \text{ volts} > |V_{TP}| + |V_{TN}| > 0.9 \text{ volts}$$

In addition, the off-leakage currents of the transistors 42 and 52 in this embodiment are reduced, for reasons that will be described below, making it possible to further reduce the power consumption of the entire circuit.

Figure 6:
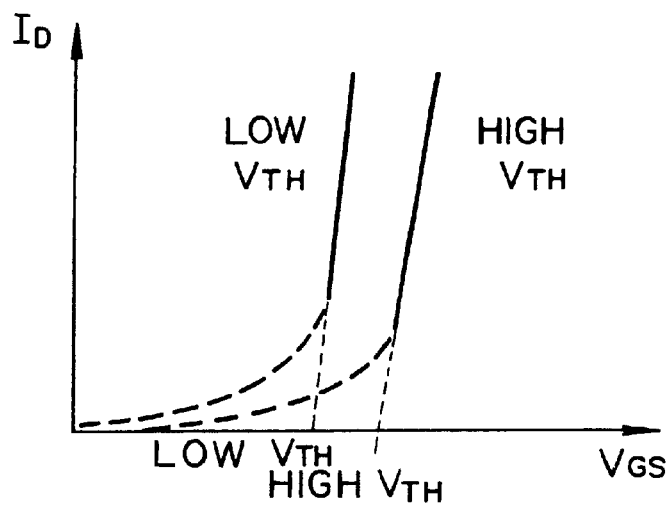
FIG. 6 is a graph of the $V_{GS}$–$I_D$ characteristic of an enhancement-mode transistor.

A characteristic graph of the relationship between the drain current $I_D$ of an enhancement-mode transistor and the voltage $V_{GS}$ between the gate and source thereof is shown in FIG. 6. It can be seen from this graph that the $I_D$–$V_{GS}$ characteristic curve of an enhancement-mode transistor shifts towards the left and the off-leakage current thereof increases, as shown by the broken lines in the figure, as the threshold voltage is made lower (in this graph, the transistor turns off when $V_{GS}$ is equal to or less than the threshold voltage $V_{TH}$, but at this region, the current $I_D$ is yet to flow through the transistor as the off-leakage current, as shown by the broken lines in the figure).

Therefore, if the threshold voltages of the transistors 42 and 52 are set to be low, as in the prior-art oscillation circuit, the off-leakage current at and below the threshold voltage is larger, and the power consumption is increased by that amount.

In contrast thereto, since the threshold voltages of the transistors 42 and 52 in this embodiment are set to large values, as shown by Equation (2), the values of the off-leakage currents that flow through the transistors 42 and 52 are greatly reduced, and thus the power consumption of the entire circuit can be reduced.

The description now turns to (1) the specific definition of the OFF region for Pch- and Nch-transistors 42, 52 and (2) stable oscillation in the inverting amplifier 30 at the OFF region of the Pch- and Nch-transistors.

(1) First of all, the OFF region for the Pch- and Nch-transistors 42, 52 will be described.

Figure 18:
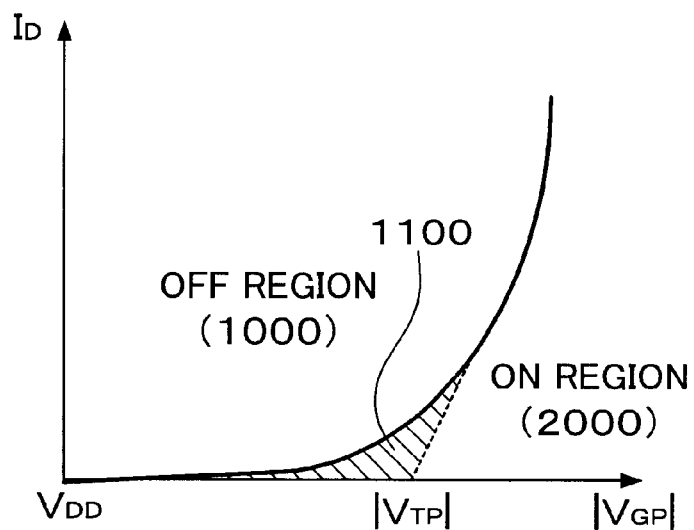
FIG. 18 illustrates ON and OFF regions.

Referring to FIG. 18, it is assumed herein that the gate voltage of the Pch-transistor 42 is $V_{GP}$; the source voltage thereof is $V_{SP}$; and the threshold voltage is $V_{TP}$. If $V_{DD} = G_{ND}$, $|V_{SP}| = V_{DD} = 0$. Thus, the difference of potential $V_{GSP}$ between the gate and source is represented by the following formula:

$$V_{GSP} |V_{GP}| = |-V_{SP}| = V_{GP}|.$$

The OFF region for the Pch-transistor 42 is then defined as regions 1000 and 1100 of $|V_{GP}| < |V_{TP}|$ shown in FIG. 18, which satisfy the following formula (a):

$$V_{GSP} = |V_{GP}| < |V_{TP}| \quad (a).$$

Conversely, the ON region becomes a region 2000 of $|V_{GP}| \geq V_{TP}|$.

The threshold voltage $V_{TP}$ is defined as the gate voltage $V_{GP}$ when the conduction type of the silicon crystal surface is completely inverted and represented by the following formula:

$$V_{TP} = 2\phi_E + [2 \cdot \in_S \cdot q N_A \cdot (2\phi_E)]^{1/2} / (\in_S / d) \quad (b)$$

where $\phi_E$ is a Fermi potential, $\in_S$ is $\in$ Si (the relative dielectric constant of silicon) multiplied by $\in 0$ (the dielectric constant of vacuum), q is an electron charge, $N_A$ is a concentration of a substrate and d is the thickness of an oxide film.

The sub-threshold region 1100 forming a part of the OFF region will be described.

In the OFF region satisfying the above formula (a), the conduction type of the silicon crystal surface is only slightly inverted. If there is a gradient in the carrier density, the carriers diffuse from one region having a high density to another region having a low density, so that the drain current $I_D$ (OFF current in transistor) flows through the OFF region. Such a drain current is called a sub-threshold current and is represented by the following formula:

$$I_D = \alpha \cdot \exp[q \cdot (V_{GP} - V_{TP}) / k \cdot T] \quad (c)$$

Where $\alpha$ is a coefficient; k is Botzmann's constant; and T is an absolute temperature.

Referring to FIG. 18, the region 1100 through which such a drain current flows is called a sub-threshold region and forms a part of the OFF region.

The OFF region for the Nch-transistor 52 is similar to that for the Pch-transistor 42 and will not further be described herein.

The description of the OFF region for each of said transistors 42 and 52 is applicable to each embodiment which will be described.

(2) The description now turns to the continuity of oscillation in the ON/OFF region.

(2-1) Even if the Pch- and Nch-transistors 42, 52 are simultaneously turned off in the drive region of the inverting amplifier 30, the sub-threshold current $I_D$ (OFF current in transistor) flows through the sub-threshold region 1100 of the above item (1). Thus, oscillation may continue by the power supplied from the power source $V_{reg}$ corresponding to the current $I_D$.

(2-2) Furthermore, the present embodiment uses a high value Q which is an index representing the degree of easiness in mechanical oscillation. The value Q increases inertial oscillation in the crystal oscillator 10. In the sub-threshold region of the above item (1), therefore, it is possible to maintain stable oscillation with a little power being supplied from the power supply circuit 60. The value Q is represented by the following formula:

$$Q=\alpha/Rxt$$

where Rxt is a component of resistance in the crystal oscillator; and $\alpha$ is a coefficient.

It is desirable that the value Q is equal to or higher than 10,000.

(Modified Form of First Embodiment)

In order to further reduce the power consumption and satisfy the following formulae, the threshold voltages $V_{TP}$ and $V_{TN}$ of the transistors 42 and 52 should not be reduced. The constant voltage $V_{reg}$ should be reduced to its lower limit.

$$|V_{reg}| \leq |V_{TP}|+|V_{TN}| \quad (2)$$

$$|V_{reg}|>|V_{TP}|, \; |V_{reg}|>|V_{TN}| \quad (3)$$

Figure 19:
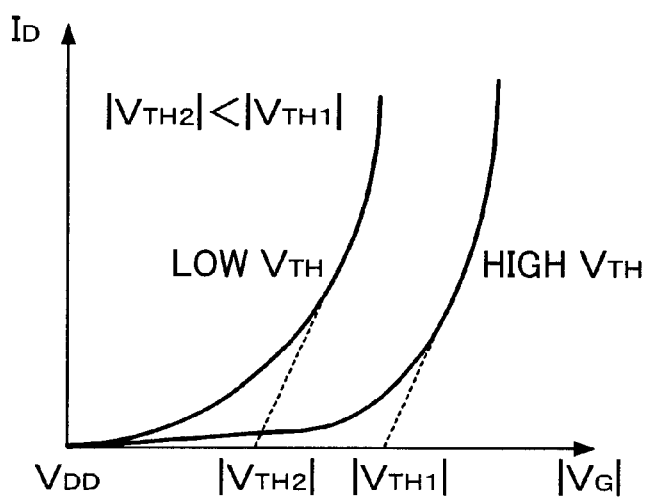
FIGS. 19 to 21 illustrate VG–ID characteristics.

In other words, as shown in FIG. 19, the drain current $I_D$ at the sub-threshold region 1100 increases exponentially when the threshold voltage decreases as it is apparent from the formula (c). Therefore, it is undesirable to reduce the threshold voltage.

Figure 20:
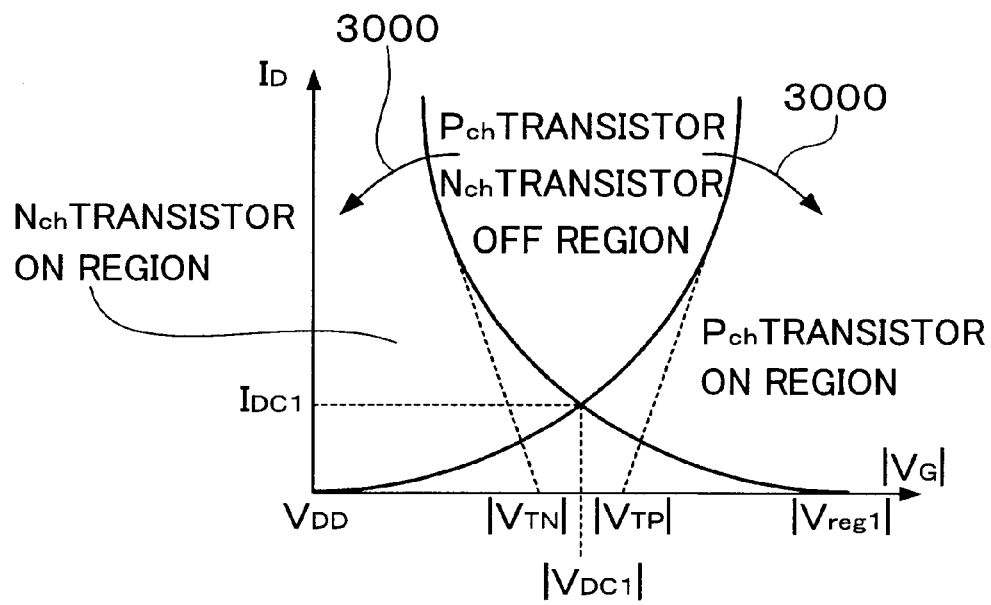
Figure 21:
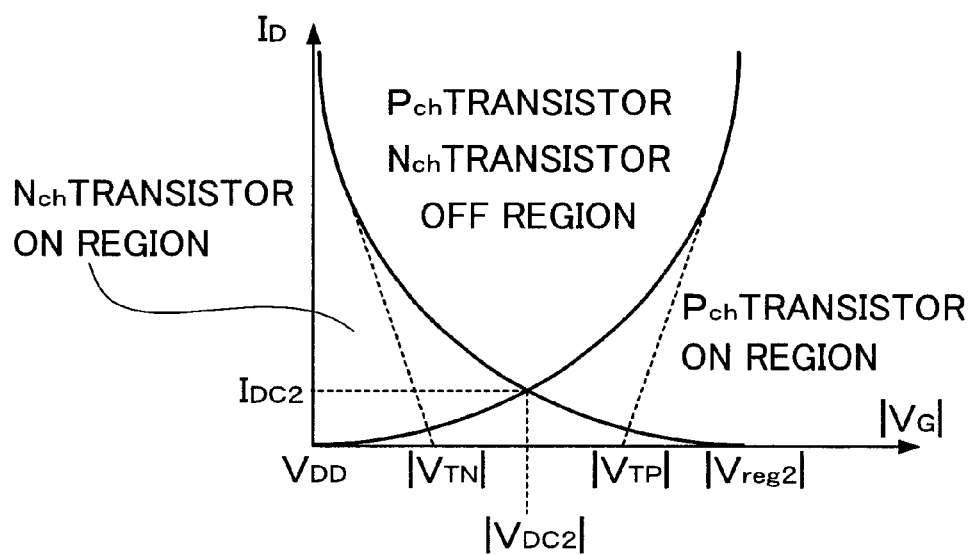

FIGS. 20 and 21 show the changes in only the $V_{reg}$. The relationship between $V_{reg1}$ and $V_{reg2}$ in FIGS. 20 and 21 is $|V_{reg1}|>|V_{reg2}|$. (The threshold voltage is the same in FIGS. 20 and 21).

As shown in FIG. 20, a curve $V_G$–$I_D$ is shifted in a direction of arrow 3000 when $|V_{reg}|$ decreases.

Comparing the drain currents $I_{DC}$ relative to the DC bias voltage $V_{DC}$ in the inverting amplifier 30 in FIGS. 20 and 21, it is apparent that $I_{DC1}>I_{DC2}$. Therefore, it is possible to reduce the current consumption when the absolute value of the constant voltage $|V_{reg}|$ is reduced.

This raises a problem with a design devised for reducing the current to the maximum as in FIG. 21. The constant and threshold voltages may vary among oscillation circuits that are produced in large quantities. The constant voltage $V_{reg2}$ may be reduced to a level lower than the target level and the threshold voltages $V_{TP}$ and $V_{TN}$ may exceed the target levels. As it is apparent from the aforementioned formula (c), the drain current at the sub-threshold region may too be reduced making oscillation unstable.

Figure 27A:
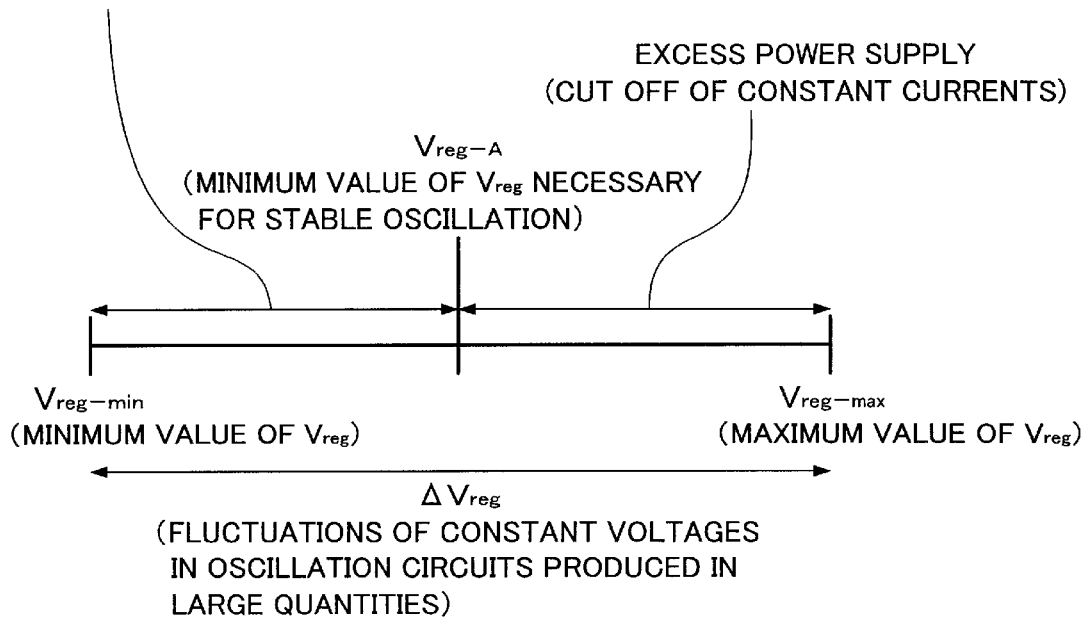
FIGS. 27A and 27B illustrate target constant voltages.

For example, as shown in FIG. 27A it is assumed that the minimum constant voltage required for stabilizing oscillation is $V_{reg-A}$; and the range of fluctuations of the constant voltages in the oscillation circuits which are produced in large quantities is $\Delta V_{reg}$. If the target value of the constant voltage is the aforementioned minimum constant voltage $V_{reg-A}$, the values of the constant voltages in the actual products fluctuate between Maximum $V_{reg-min}=V_{reg-A}-(\Delta V_{reg}/2)$ and Minimum $V_{reg-max}=V_{reg-A}+(\Delta V_{reg}/2)$.

Therefore, it is impossible to stabilize oscillation if the constant voltages vary among oscillation circuits which are produced in large quantities and when the constant voltage $V_{reg}$ becomes smaller than the target level $V_{reg-A}$.

Figure 22:
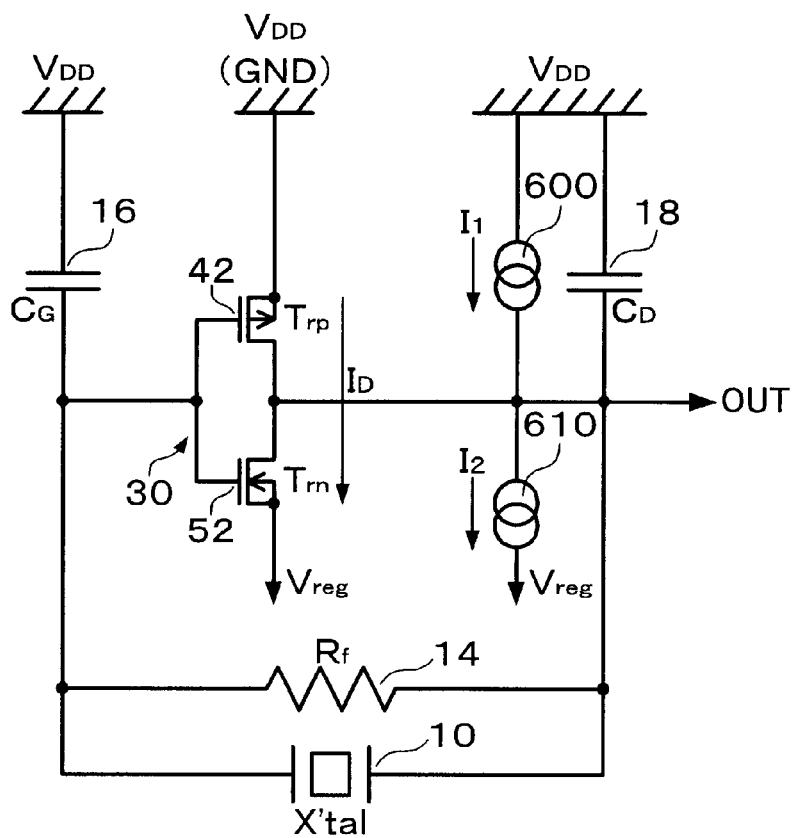
FIGS. 22 to 25 are circuit diagrams of the other forms of crystal oscillation circuit according to the present invention.

To overcome such a problem, this embodiment uses such an arrangement of circuit as shown in FIG. 22.

The circuit supplies an additional current from constant current sources 600 and 610 connected in parallel to the respective transistors 42 and 52, in order to offset a shortage of power necessary for stabilizing oscillation caused by the reduction of the drain current $I_D$ at the sub-threshold region due to the fluctuations of the constant voltages in oscillation circuits produced in great quantities.

With the Nch-transistor 52, the operating current at the sub-threshold region becomes equal to the sum of the sub-threshold current $I_D$ of the transistor 52 and the current I2 of the constant current source 610. With the Pch-transistor 42, conversely, the operating current at the sub-threshold region becomes equal to the sum of the sub-threshold current $I_D$ of the transistor 42 and the current I1 of the constant current source 600. Thus, oscillation may be stabilized even though the actual value $V_{reg}$ becomes smaller than the target value $V_{reg-A}$ set in the designing process due to the fluctuations of the constant voltages in oscillation circuits that are produced in large quantities. Furthermore, oscillation may be stabilized even though the values $V_{TP}$ and $V_{TN}$ are increased to reduce the drain current at the sub-threshold region.

Modification of Constant Voltage to be Designed

There are many types of fluctuations in $V_{reg}$, $V_{TP}$ and $V_{TN}$. For example, $V_{reg}$ may be increased or $V_{TP}$ and $V_{TN}$ may be reduced. The drain current at the sub-threshold region may be sufficiently high, so that the currents from the constant current sources 600 and 610 become unnecessary for stable oscillation.

For example, when the target constant voltage is equal to the aforementioned minimum constant voltage $V_{reg-A}$ as shown in FIG. 27A, the constant voltage $V_{reg}$ may be higher than the target level $V_{reg-A}$ resulting in excess power supply. In such a case, even though all the constant currents are cut off, it is impossible to reduce the power consumption.

Figure 27B:
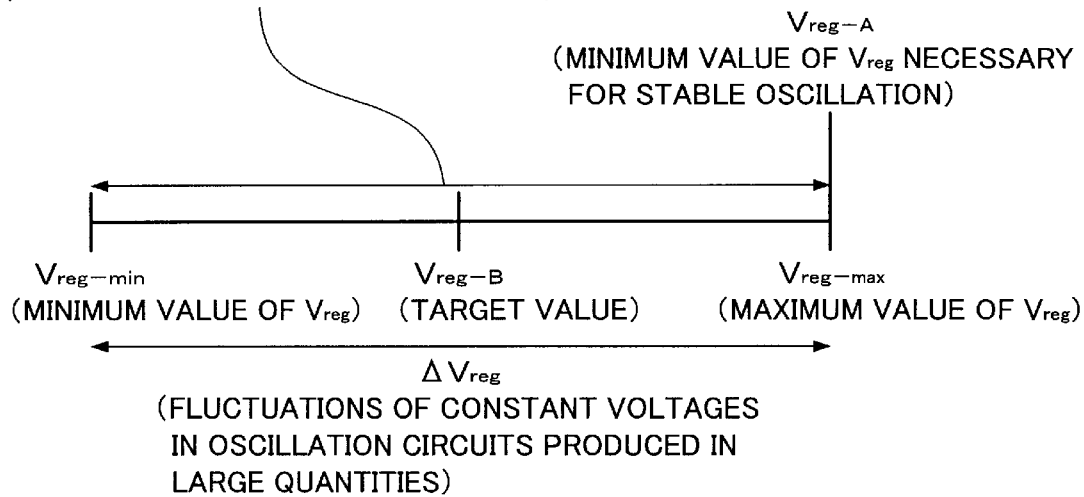

In order to overcome the above problem, the present embodiment designs a product so that the target constant voltage is equal to $V_{reg-B}$, for example, as shown in FIG. 27B.

More particularly, the target constant voltage $V_{reg-B}$ is set to be between the absolute value of the minimum constant voltage required for stable oscillation and the absolute value of the first constant voltage $V_{reg-MIN}$ smaller than the absolute value of said minimum constant voltage by the range of fluctuations $\Delta V_{reg}$ of the constant voltages in oscillation circuits which are produced in large quantities. In this embodiment, the desired value is set Target value $V_{reg-B}$=(Minimum constant voltage $V_{reg-A}$)−($\Delta V_{reg}/2$).

Further, the present embodiment takes an arrangement for supplying an additional current from the constant current sources 600 and 610 connected in parallel to the respective transistors 42 and 52, in order to offset a shortage of power necessary for stabilizing oscillation.

In such a manner, it is possible to stabilize oscillation and reduce the power consumption even if the constant voltages $V_{reg}$ vary among oscillation circuits which are produced in large quantities.

Modified Example of Circuit in FIG. 22

Figure 23:
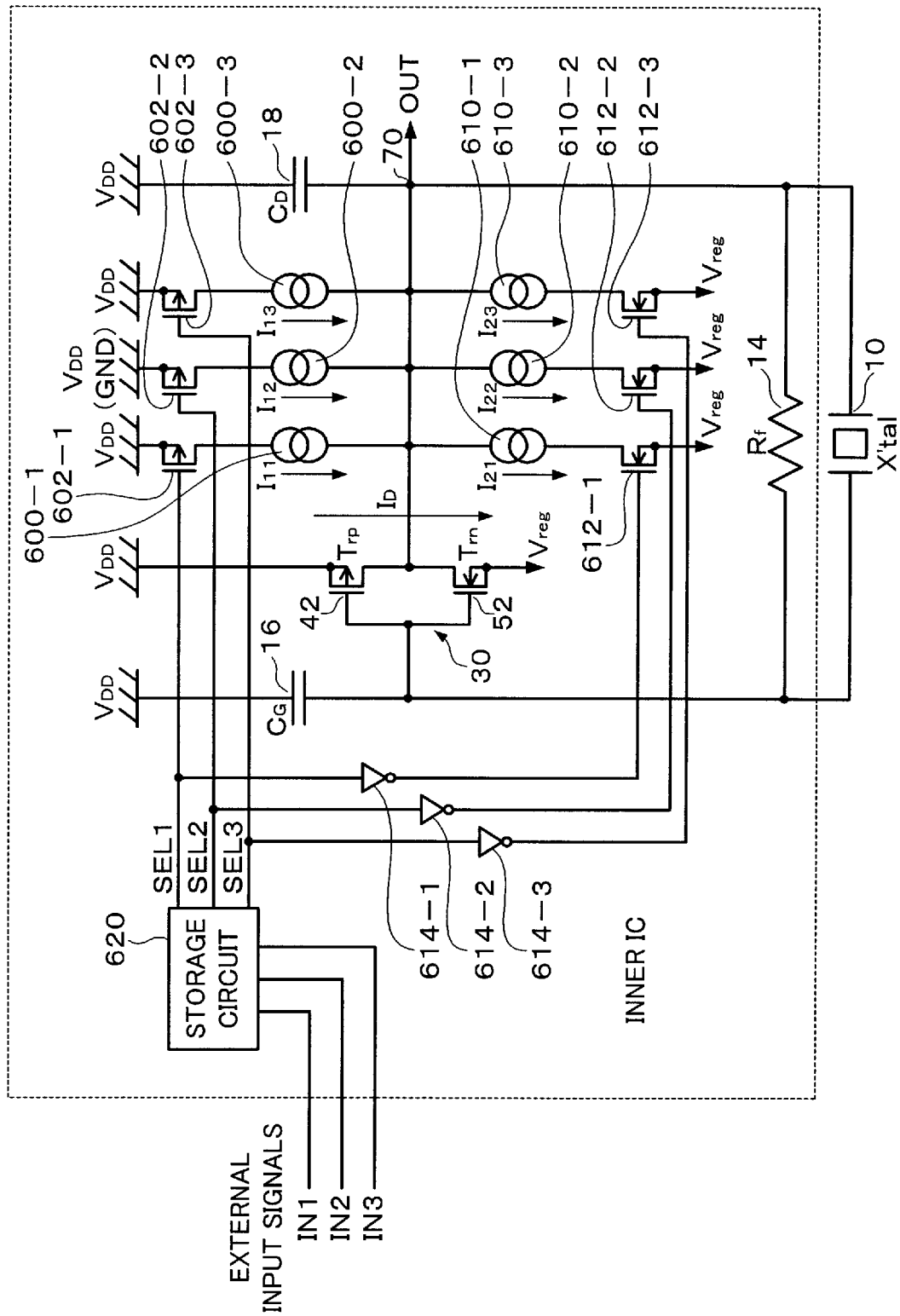

The present embodiment takes an arrangement of circuit shown in FIG. 23 so as to fully deal with fluctuations of the constant voltages $V_{reg}$ in oscillation circuits, which are produced in large quantities. In the embodiment, it is preferred to design the product, for example, such that the target constant voltage $V_{reg\text{-}B}$ is set to be between the absolute value of the minimum constant voltage required for stabilizing oscillation and the absolute value of the first constant voltage $V_{reg\text{-}MIN}$ smaller than the absolute value of said minimum constant voltage by the range of fluctuations $\Delta V_{reg}$ of the constant voltages in oscillation circuits which are produced in great quantities as shown in FIG. 27B.

According to the present embodiment, an oscillation circuit comprises a plurality of constant current sources 600-1, 600-2, 600-3, 610-1, 610-2 and 610-3 and a selection circuit for selecting one of the constant current sources. The current value in a constant current source that may stabilize oscillation is optimized during the IC producing step (inspection step) to provide the circuit shown in FIG. 22.

More particularly, a transistor 42 is connected in parallel to the first group of constant current sources 600-1, 600-2 and 600-3 while a transistor 52 is connected in parallel to the second group of constant current sources 610-1, 610-2 and 600-3.

The selection circuit comprises constant current source selection switching elements 602-1, 602-2, 602-3, 612-1, 612-2 and 612-3, each of which is connected in series to the respective one of the transistors 600-1, 600-2, 600-3, 610-1, 610-2 and 610-3.

A storage circuit 620 receives either of external input signals IN1, IN2 and IN3. The storage circuit 620 responds to the received external input signals to selectively output the corresponding one of said three selection signals SEL1, SEL2 and SEL3.

Each of the three selection signals SEL1, SEL2 and SEL3 output from the storage circuit 620 is then input into the corresponding one of the switching elements 602-1, 602-2 and 602-3 and also into the gate of the corresponding one of the switching elements 612-1, 612-2 and 612-3 through the corresponding one of inverters 614-1, 614-2 and 614-3.

Therefore, if the selection signal SEL1 is output, a pair of transistors 602-1 and 612-1 are turned on and a pair of constant current sources 600-1 and 610-1 are selected.

Similarly, if each of the selection signals SEL2 and SEL3 is output, another pair of constant current sources 600-2 and 610-2 or 600-3 and 610-3 are selected.

The detail of FIG. 23 will be described below.

The constant currents from the constant current sources 600-1, 600-2, 600-3, 610-1, 610-2 and 610-3 are set as follows:

$I_{11}>I_{12}>I_{13}$ and $I_{21}>I_{22}>I_{23}$.

In the IC inspection step, the drain current $I_D$ at the sub-threshold region is first measured.

From the result of measurement, if it is judged that the drain current $I_D$ required for stable oscillation is insufficient, an external signal for selecting a constant current source for supplying an additional current is input into the storage circuit 620. The external signal input into the storage circuit 620 may include IN1=Low level, IN2=High level and IN3=High level, for example. In response to such an input, the storage circuit 620 outputs SEL1=Low, SEL2=High and SEL3=High and selects the constant current sources having large currents.

If it is judged that the drain current $I_D$ is sufficiently large and an additional current is unnecessary for stable oscillation from the result of measurement, an external signal including IN1=High level, IN2=High level and IN3=High level is then input into the storage circuit 620. In response to such an input, the storage circuit 620 outputs SEL1=High, SEL2=High and SEL3=High and does not select the constant current sources 600 and 610.

In such a manner, the current value of the constant current source required for stable oscillation is optimized against fluctuations of the constant voltages in oscillation circuits which are produced in large quantities.

The circuit of FIG. 23 may select one of eight combinations of constant current sources 600 and 610. Further, three external input signals may be added so that the circuit may use six external input signals for individually selecting each of the constant current sources 600 and 610. (This is because the values $V_{TP}$ and $V_{TN}$ do not fluctuate in a single direction in oscillation circuits which are produced in large quantities.)

The circuits of FIGS. 22 and 23 are similar for having the constant current sources 600 and 610, but are different from each other in the drain current characteristics at the sub-threshold regions of the Pch- and Nch-transistors depending on the IC producing process.

In such a case, an additional current required for stable oscillation may be supplied from either of the constant current source 600 or 610, if necessary.

The embodiments have been described as to the oscillation circuit which comprises a plurality of constant current sources, each of which can be in turn selected during the IC inspection process. The oscillation circuit may only include a single constant current source, the capacity of which can be adjusted during the IC inspection process. For example, the back-gate effect in FET forming the constant current source may be utilized to change the threshold value in FET for controlling the value of the constant current supplied as the drain current.

The storage circuit 620 may be formed by EEPROM, ferroelectric memory, non-volatile memory, FUSE and laser-cutting type memory or the like.

(3) The relationship between $V_{TP}$ and $V_{TN}$ when they satisfy the above formulae (2) and (3) will be described below.

In the formulae (2) and (3), the values $V_{TP}$ and $V_{TN}$ may have either of the following relationships:

$|V_{TP}|=|V_{TN}|$ and $|V_{TP}|\neq|V_{TN}|$.

With $|V_{TP}|\neq|V_{TN}|$, for example, the voltages for initiating and terminating oscillation may be reduced while satisfying the formulae (2) and (3).

Second Embodiment

The first embodiment was described above as being configured in such a manner that the threshold voltages of the transistors 42 and 52 satisfied Equation (2) to reduce the short-circuiting current, by way of example. This second embodiment of the invention makes it possible to reduce the short-circuiting current of the inverting amplifier 30 in a manner similar to that of the first embodiment, by applying direct current (DC) bias voltages to the gates of the transistors 42 and 52, even when those transistors 42 and 52 are configured to satisfy the condition of Equation (1), as in the prior art.

Figure 7:
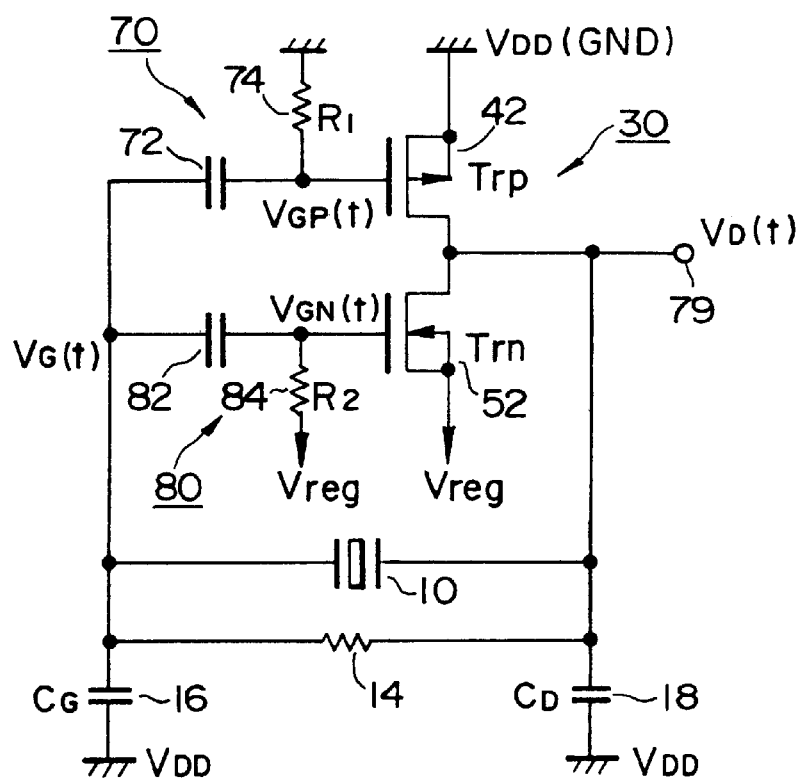
FIG. 7 is a circuit diagram of a second embodiment of the crystal oscillation circuit in accordance with this invention.
Figure 8:
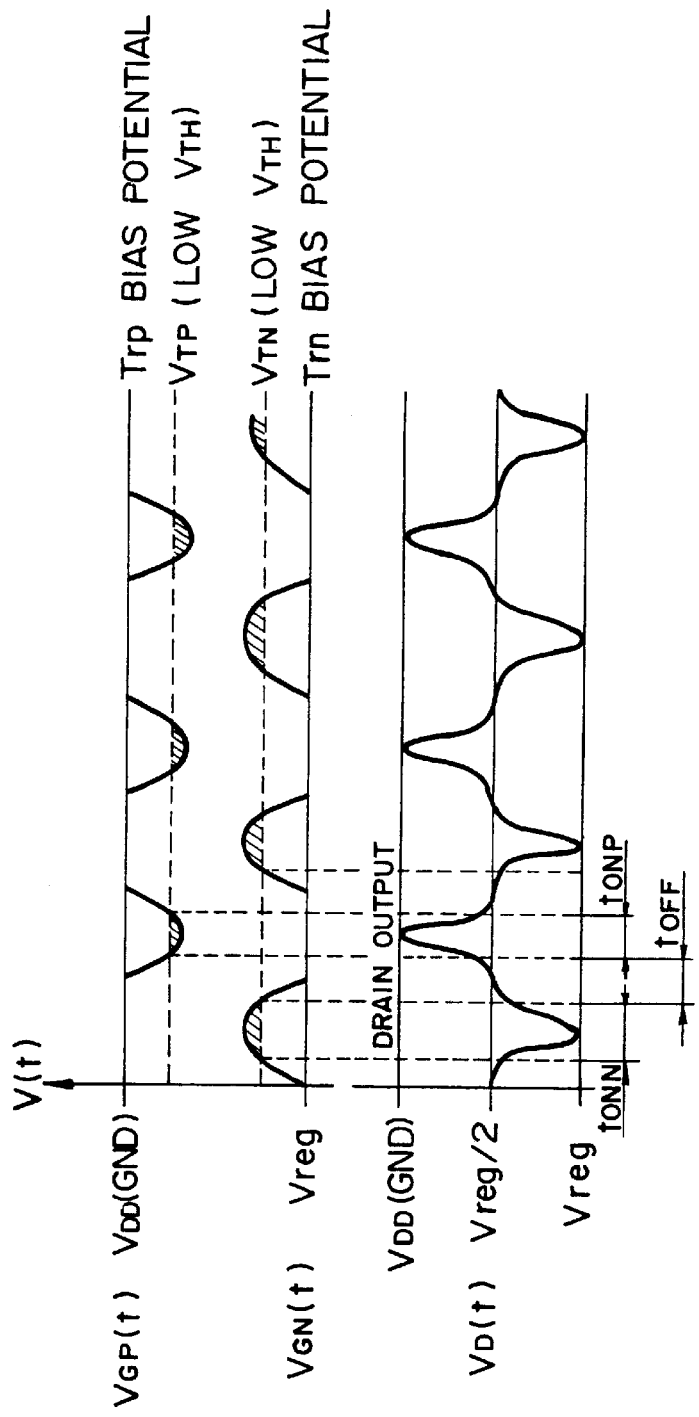
FIG. 8 is a timing chart of the second embodiment.

The crystal oscillation circuit of this embodiment is shown in FIG. 7 and a timing chart thereof is shown in FIG. 8.

This crystal oscillation circuit comprises a first bias circuit 70 and a second bias circuit 80 that each cause a shift in the DC potential of the feedback input $V_{G(t)}$ of the inverting amplifier 30 that is input to the gates of the transistors 42 and 52.

These bias circuits 70 and 80 each comprises a capacitor 72 or 82 for removing the DC component, and a resistor 74 or 84 for applying a DC bias voltage.

The capacitors 72 and 82 are used to remove the DC component from the gate signal $V_{G(t)}$ and apply the resultant signal to the gates of the corresponding transistors 42 and 52.

The resistor 74 is connected between the gate of the transistor 42 and the ground potential $V_{DD}$, to pull the DC potential of the feedback input $V_{G(t)}$ that is input to the gate of the transistor 42 up to the ground potential $V_{DD}$.

The resistor 84 is connected between the gate of the transistor 52 and the power voltage $V_{reg}$, to pull the DC potential of the feedback input $V_{G(t)}$ that is input to the gate of the transistor 52 down to the power source potential $V_{reg}$.

The above configuration ensures that the gate signal $V_{G(t)}$ that is input as feedback to the inverting amplifier 30 is applied to the gates of the transistors 42 and 52 in states in which the DC potential thereof has been converted to $V_{DD}$ and the power source potential $V_{reg}$ by the first and second bias circuits 70 and 80, as indicated by $V_{GP(t)}$ and $V_{GN(t)}$.

There is therefore is no period of time at which both of the transistors 42 and 52 are on while the transistors 42 and 52 are being driven to turn on and off alternately, and, as a result, the short-circuiting current flowing through the inverting amplifier 30 is greatly reduced, in a similar manner to that of the first embodiment, making it possible to reduce the power consumption.

In particular, this embodiment makes it possible to reduce the short-circuiting currents even when the absolute values of the threshold voltages of the enhancement-mode transistors 42 and 52 are made smaller. As a result, the power voltage applied to the inverting amplifier 30 is smaller, which also helps to make it possible to reduce the power consumption.

Note that the bias voltages applied to the first and second bias circuits 70 and 80 could equally well be shifted in such a manner that the DC potentials of the feedback inputs to the gates of the transistors 42 and 52 are at potentials other than those of this embodiment, provided that the transistors 42 and 52 are not on simultaneously.

It should be noted that this invention is not limited to the above described embodiments, and it can be modified in various different ways within the range of the invention.

For example, the descriptions of the above embodiments were based on configurations in which each of the first and second circuits 40 and 50 had a single transistor, by way of example, but other configurations could be devised in which other circuit elements could be incorporated into the circuits if necessary, without causing any loss of function of the first and second circuits 40 and 50.

In addition, it is preferable that a semiconductor device is fabricated to comprise the crystal oscillation circuit of the above embodiments, or an electronic circuit that comprises such a crystal oscillation circuit, and this semiconductor device could be mounted in portable electronic equipment that has a restricted power source capacity, such as a portable telephone, a portable computer terminal, or any other type of portable equipment.

Furthermore, the descriptions of the above embodiments were based on the use of the crystal oscillation circuit in an electronic circuit for a timepiece, by way of example, but the present invention is not limited thereto. It has many other applications and is extremely effective when used in a wide range of portable electronic equipment that have restricted power source capacities, such as portable telephones, portable computer terminals, or any other type of portable equipment.

(Modified Forms)

If the conditions in the oscillation circuit are set to satisfy the formulae (2) and (3) in the present invention, it may be difficult to start oscillation depending on the values of $V_{reg}$, $V_{TP}$ and $V_{TN}$.

Figure 24:
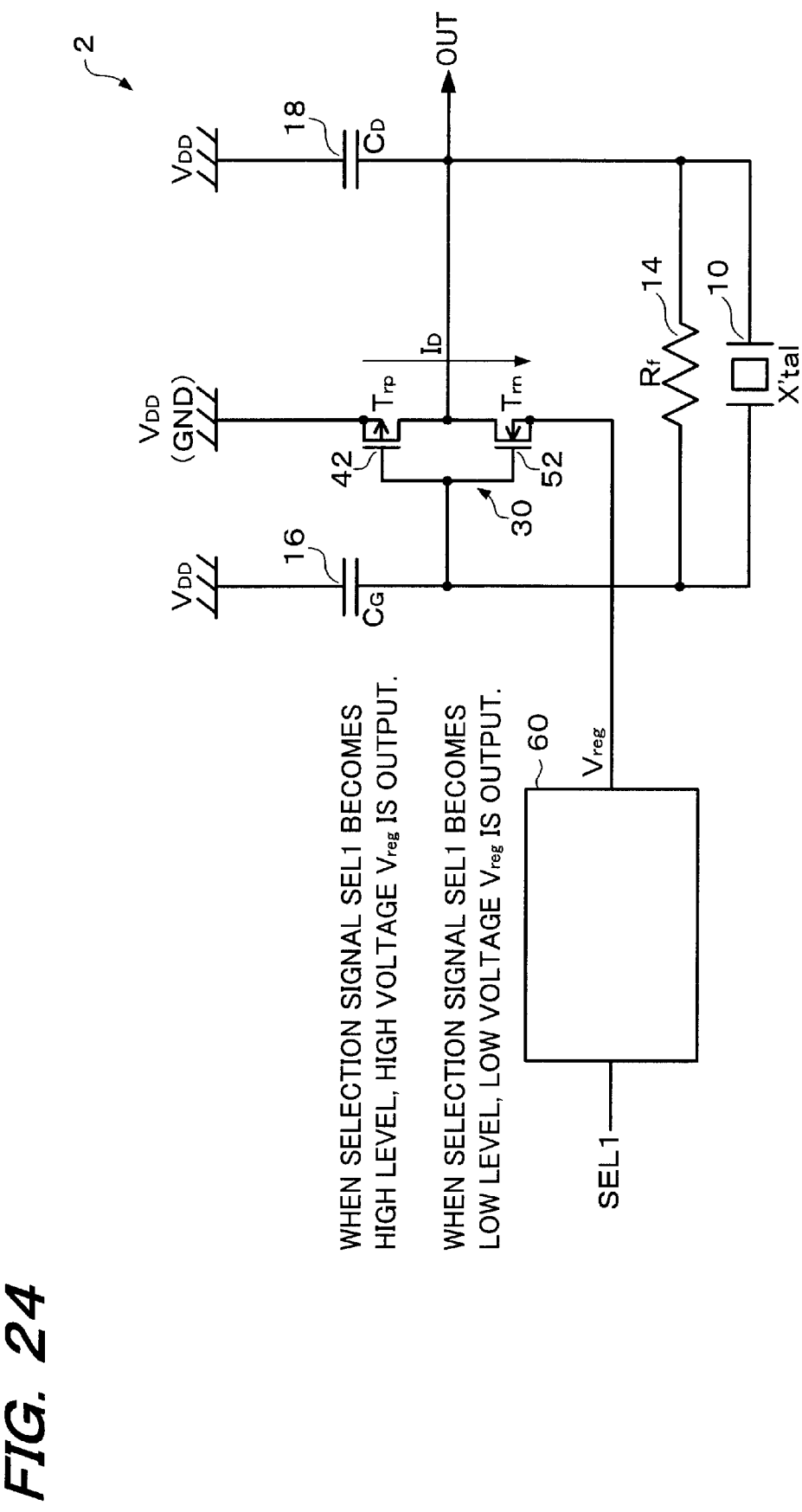

(1) First modified form:

In order to overcome the above problem, as shown in FIG. 24, an oscillation circuit according to the first modified form comprises a power supply circuit 60 for selectively outputting one of two constant voltages $V_{reg}$ depending on a selection signal SEL1 and a voltage control circuit for generating and outputting the selection signal SEL 1 used to switch the constant voltages $V_{reg}$ from one to another which are output from the power supply circuit 60 at the start of oscillation and after oscillation is stabilized. In order to generate the selection signal, the voltage control circuit uses such a selection signal forming circuit 850 as shown in FIG. 26 and which will be described later.

On starting oscillation, the oscillation circuit quickly initiates oscillation by increasing the absolute value of $V_{reg}$ under the condition which satisfies the following formulae (f) and (g):

$$|V_{reg}|>|V_{TP}|+|V_{TN}| \quad (f)$$

$$|V_{reg}|>|V_{TP}|, \ |V_{reg}|>|V_{TN}| \quad (g)$$

After the oscillation becomes stable, the oscillation circuit reduces the power consumption by decreasing the value $V_{reg}$ under the condition that satisfies the formulae (2) and (3).

Thus, the present invention can provide an oscillation circuit which has an improved oscillation starting property and can maintain stable oscillation.

(2) Second Modified Form

In order to overcome the aforementioned problem, an oscillation circuit according to the second modified form may comprise a plurality of inverting amplifiers 30-1 and 30-2 having different threshold voltages $V_{TP}$ and $V_{TN}$ for the respective transistors 42 and 52 and an inverting-amplifier switching circuit for selecting one of these inverting amplifiers 30-1 and 30-2.

The inverting-amplifier switching circuit comprises switching elements 700-1 and 702-1 connected in series to one of the inverting amplifiers 30-1, switching elements 700-2 and 702-2 connected in series to the other inverting amplifier 30-2, an inverter 704 and a selection signal forming circuit 850 of FIG. 26 for generating a selection signal SEL 1. The selection signal SEL1 is used to selectively activate one of these pairs of switching elements (700-1, 702-1 or 700-2, 702-2), selectively driving one of the inverting amplifiers 30-1 and 30-2.

More particularly, the one inverting amplifier 30-1 is selectively driven by the selection signal SEL1 when the oscillation circuit initiates oscillation. The one inverting amplifier 30-1 has low threshold voltages $V_{TP}$ and $V_{TN}$, so that the respective transistors 42 and 52 satisfy the aforementioned formulae (f) and (g).

After the oscillation becomes stable, the other inverting amplifier 30-2 is selectively driven by said selection signal SEL1. This inverting amplifier 30-2 is formed by the transistors 42 and 52 having high threshold voltages $V_{TP}$ and $V_{TN}$ to satisfy the aforementioned formulae (2) and (3).

In such a manner, the present invention can realize an oscillation circuit which can be started up without failure and which can maintain stable oscillation with reduced power consumption after oscillation is stabilized.

(3) Circuit for forming the selection signal SEL1

Figure 25:
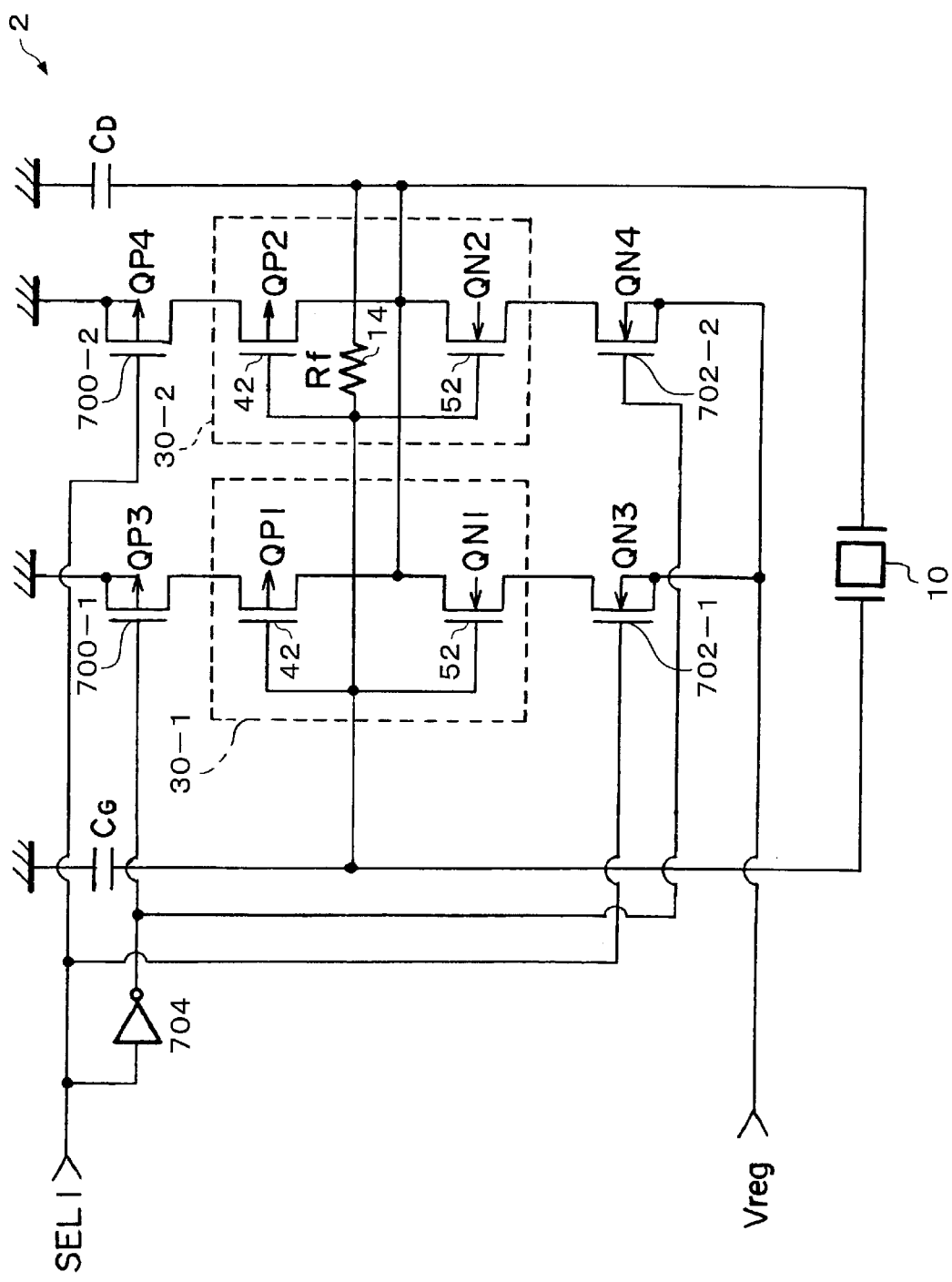
Figure 26A:
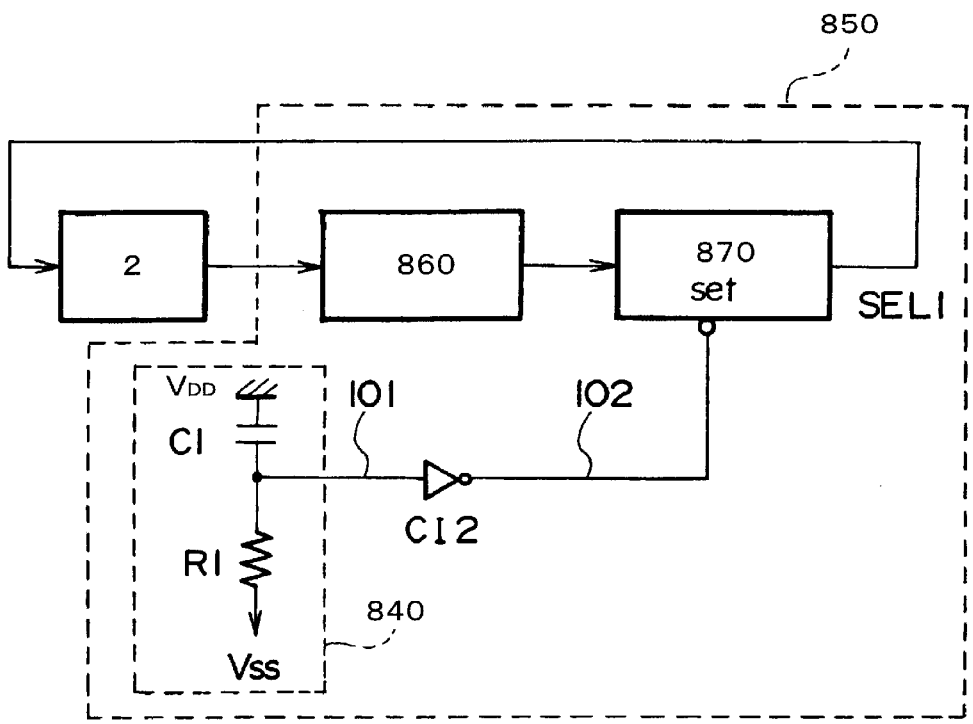
Figure 26B:
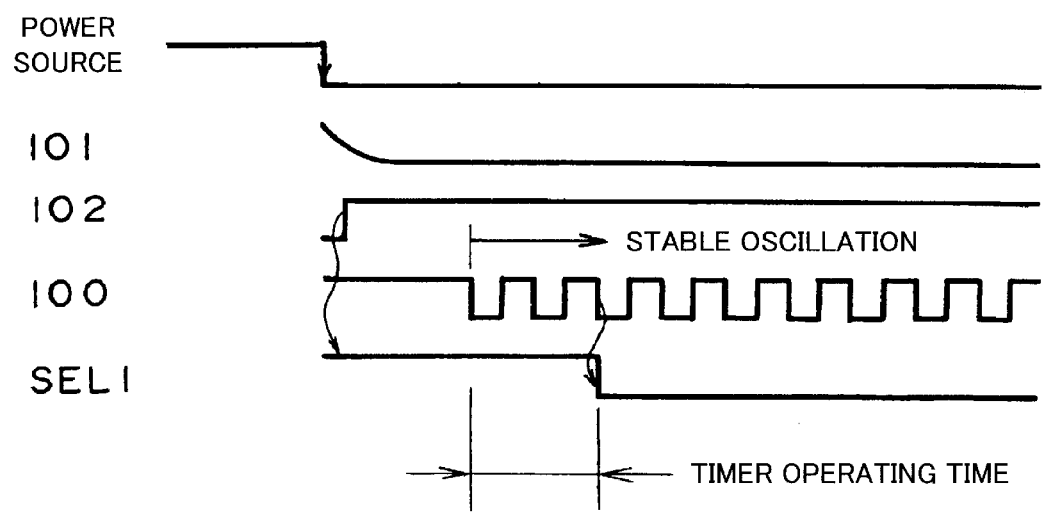
FIG. 26B is a timing chart thereof.

FIG. 26A is a functional block diagram of the selection signal forming circuit 850 for generating the selection signal SEL1 of FIGS. 24 and 25, while FIG. 26B shows a signal waveform on each line.

The selection signal forming circuit 850 according to this embodiment is connected to a crystal oscillation circuit 2 as shown in FIGS. 24 and 25 and comprises a dividing circuit 860, a clock timer setting circuit 870 and a power-on detecting circuit 840.

The power-on detecting circuit 840 comprises a capacitor C1, a resistance R1 and a CMOS inverter CI2. A ground voltage VDD is applied to one end of said capacitor C1. A power supply voltage Vss is applied to one end of said resistance R1. The other ends of the capacitor and resistance C1, R1 are connected to each other. The other end of said resistance C1 is connected to the input gate of the CMOS inverter CI2. The selection signal forming circuit 850 and crystal oscillation circuit 2 form a feedback circuit in which the selection signal SEL1 used as an output signal from the clock timer setting circuit 870 in the selection signal forming circuit 850 is input into the crystal oscillation circuit 2.

A process of forming the selection signal SEL1 will be described with reference to FIGS. 26A and 26B.

As power is applied to the circuit of FIG. 26A, the crystal oscillation circuit 2 and selection signal forming circuit 850 are started. In the power-on detecting circuit 840, a current flows from the ground voltage VDD through the capacitor C1 and resistance R1 toward the power supply voltage Vss. Thus, the potential of a line 101 decreases gradually. Since the reduced potential is an input potential into the CMOS inverter CI2, the potential of the line 101 switches the potential of a line 102, which is the output of said CMOS inverter CI2, from the power supply voltage Vss to the ground potential VDD.

On the other hand, when the power is ON, said crystal oscillation circuit 2 is started to initiate oscillation in the crystal oscillator 10. The dividing circuit 860 receives a clock signal of, for example, 32 kHz which is in turn divided into a given frequency, for example, 1 Hz. The clock signal is then output toward the clock timer setting circuit 870.

The potential of the line 102 which is controlled by the power-on detecting circuit 840 and CMOS inverter CI2 is set at the clock timer setting circuit 870 immediately after power is turned on and while the power supply voltage Vss is being held. At this time, the selection signal SEL1 of High level for starting oscillation is output from the clock timer setting circuit 870 toward the crystal oscillation circuit 2. Thus, The circuit of FIG. 24 causes the power supply circuit 60 to output the high voltage $V_{reg}$ for starting oscillation, while the circuit of FIG. 25 selectively drives the first inverting amplifier 30-1 for starting oscillation.

As described, the potential on the line 102 which is controlled by the power-on detecting circuit 840 and CMOS inverter CI2 is switched from the power supply voltage Vss to the ground potential $V_{DD}$. Therefore, the clock timer setting circuit 870 is unset and can receive a clock 100 from the dividing circuit 860. Thereafter, the crystal oscillation circuit 2 initiates oscillation. When the oscillation becomes stable, the dividing circuit 860 feeds a clock signal of 1 Hz to the clock timer setting circuit 870. When the clock timer setting circuit 870 counts a predetermined number of said 1 Hz clock signals 100, the selection signal SEL1 becomes Low level and is switched to another selection signal for providing stable oscillation. Thus, the circuit of FIG. 24 causes the power supply circuit 60 to output the lower voltage $V_{reg}$ for stabilizing oscillation while the circuit of FIG. 25 selectively drives the second inverting amplifier 30-1 for stabilizing oscillation. Such a condition continues so far as the crystal oscillation circuit 2 maintains stable oscillation.

In such a manner, the selection signal forming circuit 850 can accurately detect a period of time between starting oscillation and the start of stable oscillation and a period of time between the start of stable oscillation to terminating oscillation in the oscillation circuit 2, so that the selection signal SEL1 is output therefrom. Therefore, it is possible to stabilize oscillation and to reduce the power consumption.

Although the present invention has been described as to an example of the clock timer setting circuit 870 being used to count the clock signals 100 and to detect the start of stable oscillation in the crystal oscillation circuit 2 with the changes in the voltage level of the selection signal SEL1. The voltage level of the selection signal SEL1 may be changed by the power-on detecting circuit 840 without provision of the clock timer setting circuit 870. In such a case, the power-on detecting circuit 840 may be structured so that the magnitudes of the capacitor and resistance C1, R1 are regulated to provide a time constant used to secure time necessary for initiating stable oscillation.

Variations

The description now turns to other oscillation circuits that make it possible to reduce the power consumption, most obviously when the oscillation circuit is activated and when it is operating stably, as well as electronic circuitry, a semiconductor device, electronic equipment, and a timepiece that use such oscillation circuits.

Another oscillation circuit in accordance with this invention comprises an inverting amplifier and a feedback circuit that has a crystal oscillator connected between the output and input sides of the inverting amplifier, for causing the phase of an output signal from the inverting amplifier to invert and feeding the thus inverted signal back to the inverting amplifier as an input. In this case, the inverting amplifier comprises a first circuit which is connected to the side of a first potential and which comprises a first semiconductor switching element that is driven to turn on and off by the feedback input, to excite the crystal oscillator, and a second circuit which is connected to the side of a second potential that differs from the first potential and which comprises a current-limiting element that limits the charge/discharge current that is generated by the oscillation of the crystal oscillator.

When a voltage is applied to the inverting amplifier of this crystal oscillation circuit, excitation of the crystal oscillator starts. During this time, the phase of the output from the inverting amplifier is inverted and fed back as an input by the feedback circuit. The operations of inverting, amplifying, and-outputting this feedback input signal by the inverting amplifier are repeated.

The thus-repeated operations ensure that the oscillation of the crystal oscillator is increased gradually until the oscillation state of this oscillation circuit becomes stable.

In this embodiment of the invention, the inverting amplifier is configured of the first circuit, which is connected to the first potential side of the power source and which comprises the first semiconductor switching element, and the second circuit which has the current-limiting element and is connected to the second potential side of the power source.

The first semiconductor switching element is driven to turn on and off by the feedback input of the inverting amplifier, to drive the crystal oscillator. The current-limiting element limits the charge/discharge current that is generated by the oscillation of the crystal oscillator, to control the discharge of electrical energy stored in the crystal oscillator.

In other words, the prior-art crystal oscillation circuit has a circuit configuration such that the two transistors provided in the inverter are turned on and off alternately, and the crystal oscillator is discharged without any hindrance. This means the crystal oscillator must be recharged sufficiently in the next cycle, which increases the power consumption of the oscillation circuit.

In contrast thereto, this embodiment employs a configuration in which, when there is a discharge from the crystal oscillator in this embodiment, the current-limiting element of the second circuit ensures that the charging and discharging currents are limited to small values. This makes it possible to reduce the amount of power supplied during the charging part of the charge/discharge cycle of the crystal oscillator. As a result, the power consumption of the crystal oscillation circuit can be greatly reduced when it is oscillating stably.

In addition, this configuration of this embodiment is such that only the first semiconductor switching element configured of an inverting amplifier is driven to turn on and off when the crystal oscillation circuit is oscillating stably. This means that the inverting amplifier can be driven stably by applying a voltage V that takes into account the threshold voltage of this first semiconductor switching element to the inverting amplifier. Therefore, the voltage applied to the inverting amplifier can be greatly reduced, and this reduction makes it possible to cut the power consumption even further, in an efficient manner.

In this embodiment, the second circuit could also use a resistor element as the current-limiting element.

The circuit configuration in that case is preferably such that one end of this resistor element is connected to the second potential side and the other end thereof is connected to the output side of the inverting amplifier.

This configuration makes it possible to simplify the structure of the second circuit.

The second circuit could also use the second semiconductor switching element as the current-limiting element.

The circuit configuration in that case may be such that one end of the second semiconductor switching element is connected to the second potential side and the other end thereof is connected to the output side of the inverting amplifier, to ensure off-control during stable oscillation.

This configuration makes it possible to simplify the circuit structure, even when a semiconductor switching element is used as the current-limiting element, and also makes it possible to set the applied voltage to a low level during stable oscillation.

The second semiconductor switching element may be connected to the second potential side, and the second circuit may be provided with a switching element control means. This switching element control means can drive the second semiconductor switching element by the feedback input at a timing differing from that of the first semiconductor switching element when the circuit is activated, to excite the crystal oscillator. After the oscillation has stabilized, the second semiconductor switching element is controlled by the switching element control means to be turned off and function as the current-limiting element.

This configuration makes it possible to excite the crystal oscillator when the circuit is activated by alternately turning the first and second switching elements on and off, in the same way as in the prior-art oscillation circuit, and achieve a stable oscillation state within a short time. After the oscillation has stabilized, the second semiconductor switching element is controlled to turn off, making it possible to effectively cut the power consumption of the entire circuit.

Note that when a depletion-mode transistor is used as the second semiconductor switching element, controlling the turning off of the second semiconductor switching element ensures that the potential difference between the gate and source thereof is small, thus limiting the current flowing therethrough.

The first semiconductor switching element can be configured by using an enhancement-mode field-effect transistor element, where the source thereof is connected to the first potential side, the feedback input is supplied to the gate thereof, and the drain is connected to the inverter output side.

This makes it possible to effectively limit the leakage current when the turning off of the first semiconductor switching element is being controlled, by using an enhancement-mode field-effect transistor element with a large threshold voltage as the first semiconductor switching element, thus achieving a more stable oscillation.

The second semiconductor switching element could be configured by using a depletion-mode field-effect transistor element, where the source thereof is connected to the second potential side, the feedback input is supplied to the gate thereof, and the drain is connected to the inverter output side.

This makes it possible to allow a current to pass to a certain extent, even when the field-effect transistor element is controlled to be off, by using a depletion-mode field-effect transistor element as the second semiconductor switching element. This enables the charge/discharge currents to flow from the crystal oscillator to a certain extent during the charge/discharge cycle of the crystal oscillator, making it possible to maintain a more stable oscillation state.

In other words, an enhancement-mode field-effect transistor element could be used as the second semiconductor switching element, but that configuration would ensure that the current discharging circuit from the crystal oscillator through the second semiconductor switching element would be completely cut off while the element is controlled to be off. In such a case, a certain amount of discharge will be caused by the discharging circuit of the crystal oscillator and by the various circuits connected in parallel with the crystal oscillator. If it is assumed that there is absolutely no discharge from the crystal oscillator, the oscillation will be basically maintained by the inertia of the crystal oscillator itself.

In contrast thereto, by using a depletion-mode field-effect transistor element as the second semiconductor switching element, this embodiment ensures that the second semiconductor switching element functions to permit discharging to a certain extent, while limiting the charge/discharge currents, in the same manner as a high-resistance resistor. This ensures that the oscillation of the crystal oscillation circuit can be made even more stable.

The first and second semiconductor switching elements could be configured by using field-effect transistor elements of differing conductivity types.

Furthermore, the oscillation circuit of this embodiment could further comprise a power circuit for supplying a power voltage at the first and second potentials. This power circuit could be configured to supply a first power voltage at activation that has a large potential difference between the first and second potentials, and a second power voltage after the oscillation has stabilized that has a potential difference which is smaller than that of the first power voltage but larger than the absolute value of the threshold voltage of the first semiconductor switching element.

In this manner, the oscillation of the circuit is raised to a stable state in a short time by a comparatively large first power voltage when the circuit is activated, then the oscillation circuit is driven by the second, lower power voltage. This makes it possible to solve two problems of the prior art, by establishing the oscillation circuit rapidly and cutting the power consumption.

A crystal oscillator with a large Q value may be used as this crystal oscillator.

This makes it possible to maintain the stable oscillation state at an even lower power consumption after the oscillation has stabilized, by using a crystal oscillator that has a large value of Q, which represents the ease with which the oscillator vibrates mechanically.

It is also possible to reduce the power consumption of a timepiece or an item of portable electronic equipment, such as a portable telephone or computer terminal, by using an oscillation circuit of the above configuration in the fabrication of an electronic circuit, a semiconductor device, electronic equipment, or a timepiece, and thus reduce the consumption thereof of power from an internal battery or secondary battery.

Specific configurations of such portable electronic equipment are described below with reference to the accompanying drawings.

Figure 9:
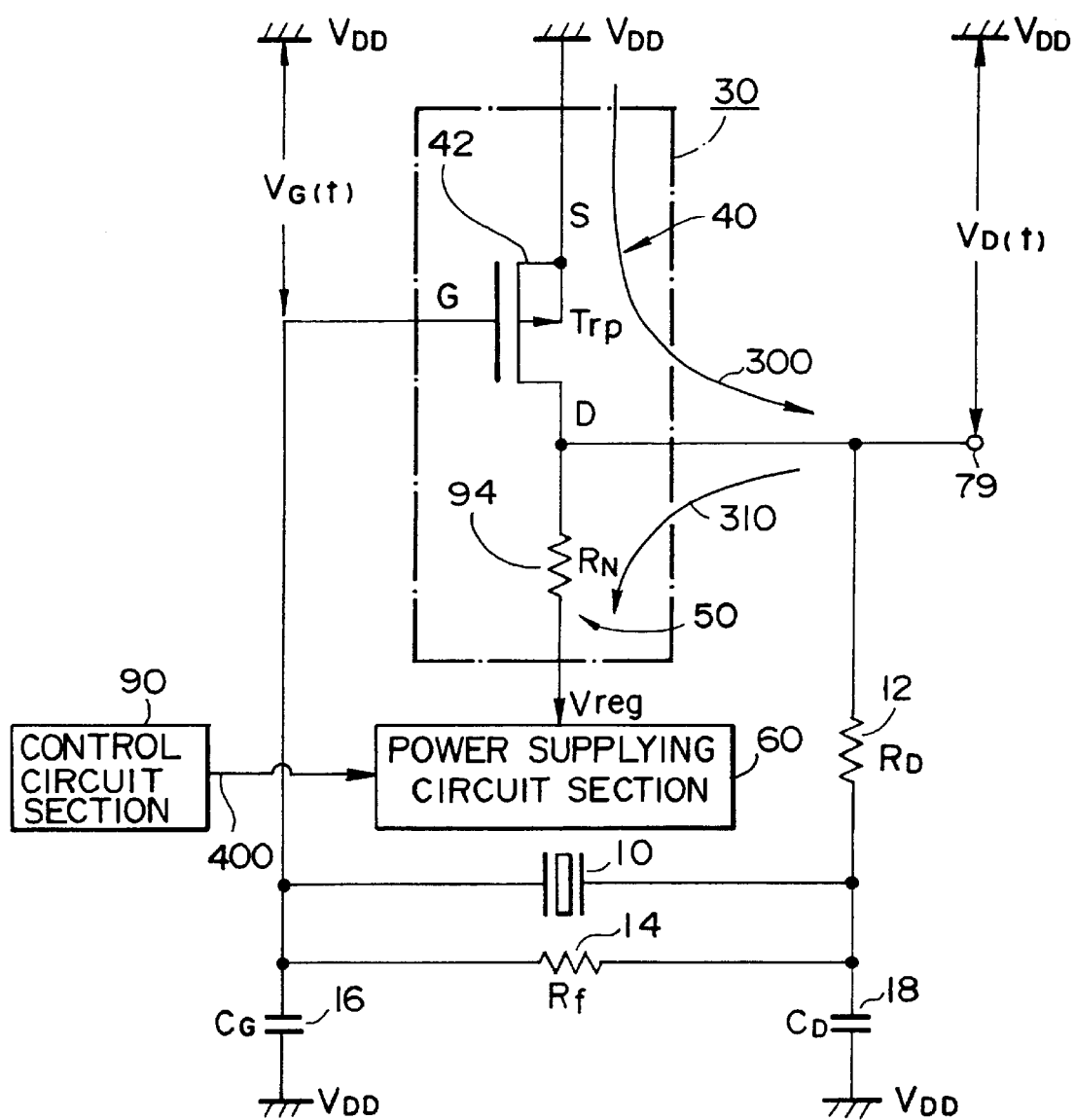
FIG. 9 is a circuit diagram of another crystal oscillation circuit.

An example of such a crystal oscillation circuit is shown in FIG. 9. The crystal oscillation circuit of this embodiment is one that is used in a quartz wristwatch. Note that components that correspond to those in FIG. 1 are given the same reference numbers in this figure and further description thereof is omitted.

In the same way as in previous embodiments, the crystal oscillation circuit of this embodiment comprises the inverting amplifier 30, the crystal oscillator 10, and a feedback circuit.

The inverting amplifier 30 comprises the first circuit 40 and the second circuit 50.

The first circuit 40 comprises the p-type field-effect transistor 42 that functions as a first semiconductor switching element. The source of this transistor 42 is connected to ground, the drain thereof is connected to an output terminal 79, and the feedback signal $V_{G(t)}$ is applied to the gate thereof.

The second circuit 50 comprises a resistor 94 that functions as a current-limiting element. One end of this resistor 94 is connected to the output terminal 79 side (in this case, it is connected to the drain of the transistor 42) and the other end thereof is connected to the power source terminal side of the power supplying circuit section 60.

Figure 10:
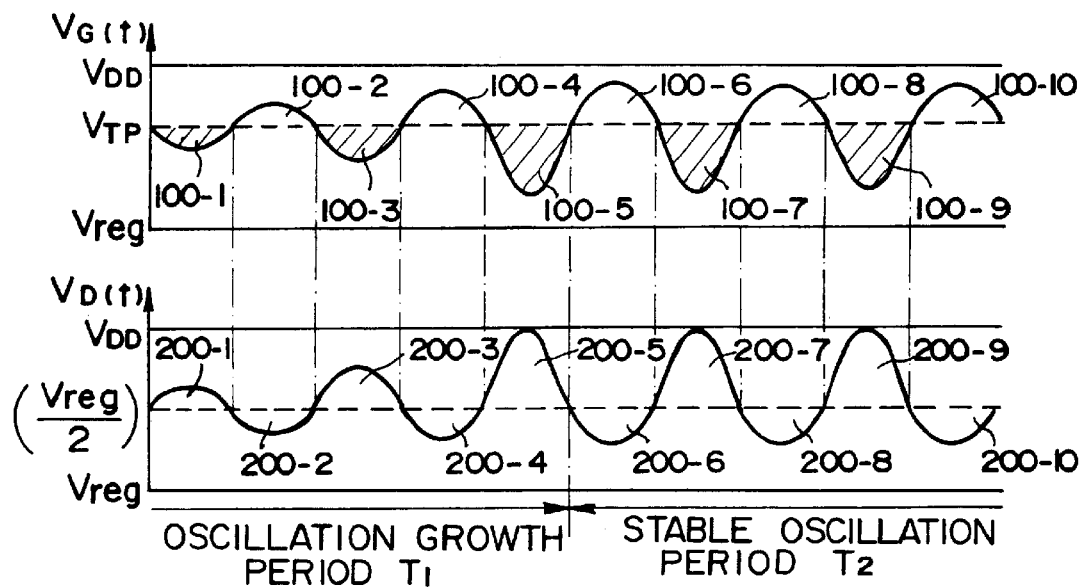
FIG. 10 is a timing chart of the circuit of FIG. 9.

A timing chart of the crystal oscillation circuit of this embodiment is shown in FIG. 10, where the elapsed time from the application of the power voltage $V_{reg}$ from the power supplying circuit section 60 is plotted along the horizontal axis and the feedback input $V_{G(t)}$ and oscillation output $V_{D(t)}$ of the inverting amplifier 30 are both plotted along the vertical axis. Note that, in this case, $V_{DD}$ represents the ground potential and $V_{TP}$, the threshold voltage of the field-effect transistor 42. Since a p-type, enhancement-mode field-effect transistor is used in this case, the threshold voltage $V_{TP}$ thereof is a negative value.

First of all, if the power voltage $V_{reg}$ from the power supplying circuit section 60 is applied to the inverting amplifier 30, the crystal oscillation circuit starts to oscillate as shown in FIG. 10. In this graph, $T_1$ represents the oscillation growth period from when the voltage is applied until a stable oscillation state is reached, and $T_2$ represents a stable oscillation period during which the oscillation output is stable.

If a gate voltage $V_{G(t)}$ that is equal to or less than the threshold voltage is applied to the gate of the transistor 42, as shown by 100-1, the transistor 42 is turned on, a current flows in the direction of an arrow 300 in FIG. 9, and the drain signal $V_{D(t)}$ which is the inversion of the gate signal $V_{G(t)}$ is output from the inverting amplifier 30. In this way, the drain signal $V_{D(t)}$ is output from the crystal oscillation circuit, as shown by 200-1.

The crystal oscillator 10 starts to be charged and excited by the current indicated by the arrow 300.

During this time, the phase of the output $V_{D(t)}$ of the inverting amplifier 30 is inverted through 180 degrees by the feedback circuit formed of the resistor 14 and other components, is output as the gate signal $V_{G(t)}$, and is fed back as an input to the gate of the transistor 42. Therefore, the gate signal $V_{G(t)}$ that is fed back exceeds the threshold voltage $V_{TP}$ in the next cycle 100-2. This controls the transistor 42 to turn off.

In this time, the charged energy of the crystal oscillator 10 is discharged through the resistor 94, as shown by an arrow 310 in FIG. 9. Therefore, the output voltage $V_{D(t)}$ of the oscillation circuit gradually decreases, as shown by 200-2 in FIG. 10.

The oscillation output $V_{D(t)}$ gradually increases and becomes stable while the charge/discharge cycle is repeated in this manner, and the oscillation state of the circuit transits from the oscillation growth period $T_1$ to the stable oscillation period $T_2$.

In FIG. 10, 100-1, 100-3, 100-5, 100-7 . . . denote periods during which a voltage that is less than or equal to the threshold voltage is applied to the gate of the transistor 42 and the transistor 42 is on, and 100-2, 100-4, 100-6, 100-8 . . . denote periods during which the transistor 42 is conversely controlled to be off.

Similarly, 200-1, 200-3, 200-5, 200-7 . . . denote the oscillation output $V_D(t)$ when the transistor 42 is on and 200-2, 200-4, 200-6, 200-8 . . . denote the oscillation output $V_{D(t)}$ when the transistor 42 is off. As shown in this figure, the oscillation output $V_{D(t)}$ is centered on a voltage ($V_{reg}/2$) that is half the voltage $V_{reg}$, and is alternately inverted for output.

In the crystal oscillation circuit of this embodiment, the discharging current of the excitation energy that is charged into the crystal oscillator 10 is controlled by the resistor 94 during the discharging cycles 200-2, 200-4, 200-6, 200-8 . . . of the crystal oscillator 10 shown in FIG. 10, so that this discharging current is at the minimum necessary.

This ensures that the energy for charging the crystal oscillator 10 in the next charging cycle is reduced, making it possible to greatly cut the power consumption of the crystal oscillation circuit as a result.

A particular feature of the crystal oscillation circuit of this embodiment is the way in which a large resistor is used as the resistor 94, greatly limiting the discharging current. In addition, an enhancement-mode transistor is used as the transistor 42, which completely cuts off the current 300 during off-control.

This makes it possible to reduce the discharging energy in the discharging cycles 200-6, 200-8, 200-10 . . . during the stable oscillation period $T_2$, as well as making it possible to maintain a stable oscillation state, as shown in FIG. 10.

In other words, the two problems of oscillating the entire circuit stably and cutting the power consumption can be solved by supplying the minimum energy necessary for maintaining the oscillation at a timing matched to the oscillation, when the circuit is oscillating stably, that is to say, at the timing of 100-7, 100-9 . . .

Note that it is preferable to use a crystal oscillator with a large Q value as this crystal oscillator 10. This ensures that energy losses due to mechanical vibrations are low when the circuit is oscillating stably, so that a sufficiently large electrical output can be fed back as an input by the crystal oscillator 10 to the gate of the inverting amplifier 30.

Therefore the crystal oscillation circuit can be driven in oscillation with an even lower power consumption and also stably.

In particular, the feedback efficiency of the output from the inverting amplifier 30 is increased by employing the above configuration, so that a smaller output from the inverting amplifier 30 will suffice. As a result, the power voltage $V_{reg}$ of the inverting amplifier 30 can be made smaller, and thus the power consumption of the entire circuit can be reduced.

In other words, the inverting amplifier 30 of this embodiment uses only the field-effect transistor 42. If seen from the viewpoint of stable operation of the inverting amplifier 30, this means that the absolute value of the power voltage $V_{reg}$ supplied from the power supplying circuit section 60 can be set to a value that exceeds the absolute value of the threshold voltage of that one transistor 42. Therefore the power voltage $V_{reg}$ can be made greatly smaller than the value required for turning the two field-effect transistors on and off, as in the prior-art crystal oscillation circuit, and thus a crystal oscillation circuit with an even lower power consumption can be implemented.

Figure 15:
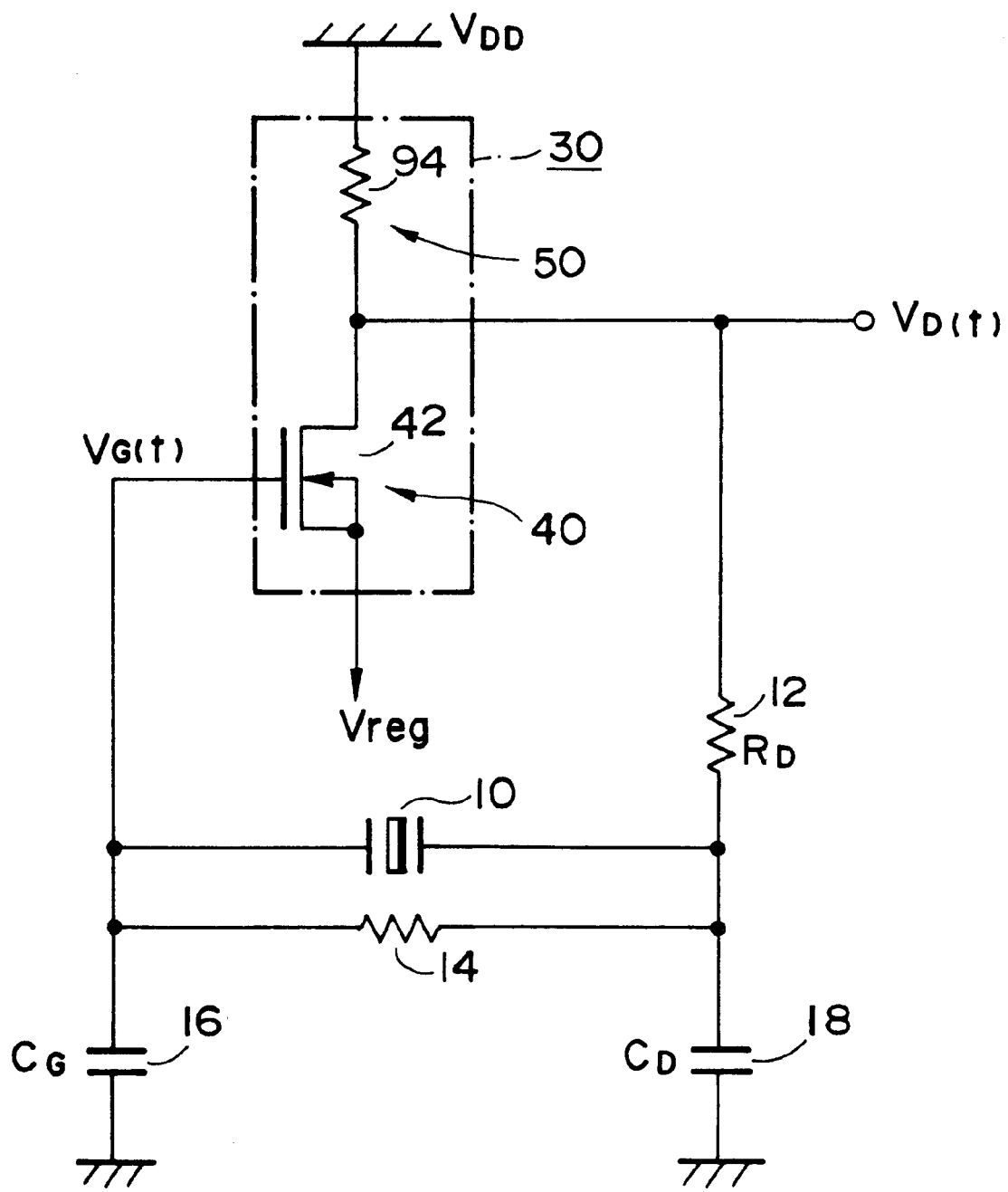
FIG. 15 shows a variation on the crystal oscillation circuit of FIG. 9.

If necessary, the crystal oscillation circuit could be configured by using the inverting amplifier 30 shown in FIG. 15 instead of the inverting amplifier 30 shown in FIG. 9.

In other words, the inverting amplifier 30 of FIG. 9 was described by way of example as having the first potential to which the first circuit 40 is connected as a ground potential side and the second potential to which the second circuit 50 is connected as the negative power potential $V_{reg}$ side, but conversely the first potential to which the first circuit 40 is connected could be the negative power potential $V_{reg}$ and the second potential to which the second circuit 50 is connected could be at the ground potential $V_{DD}$. In such a case, the circuit uses the resistor 94 to ensure that the charging current of the crystal oscillator 10 is limited, but a similar effect as that of FIG. 9 can also be employed therefor.

Figure 12:
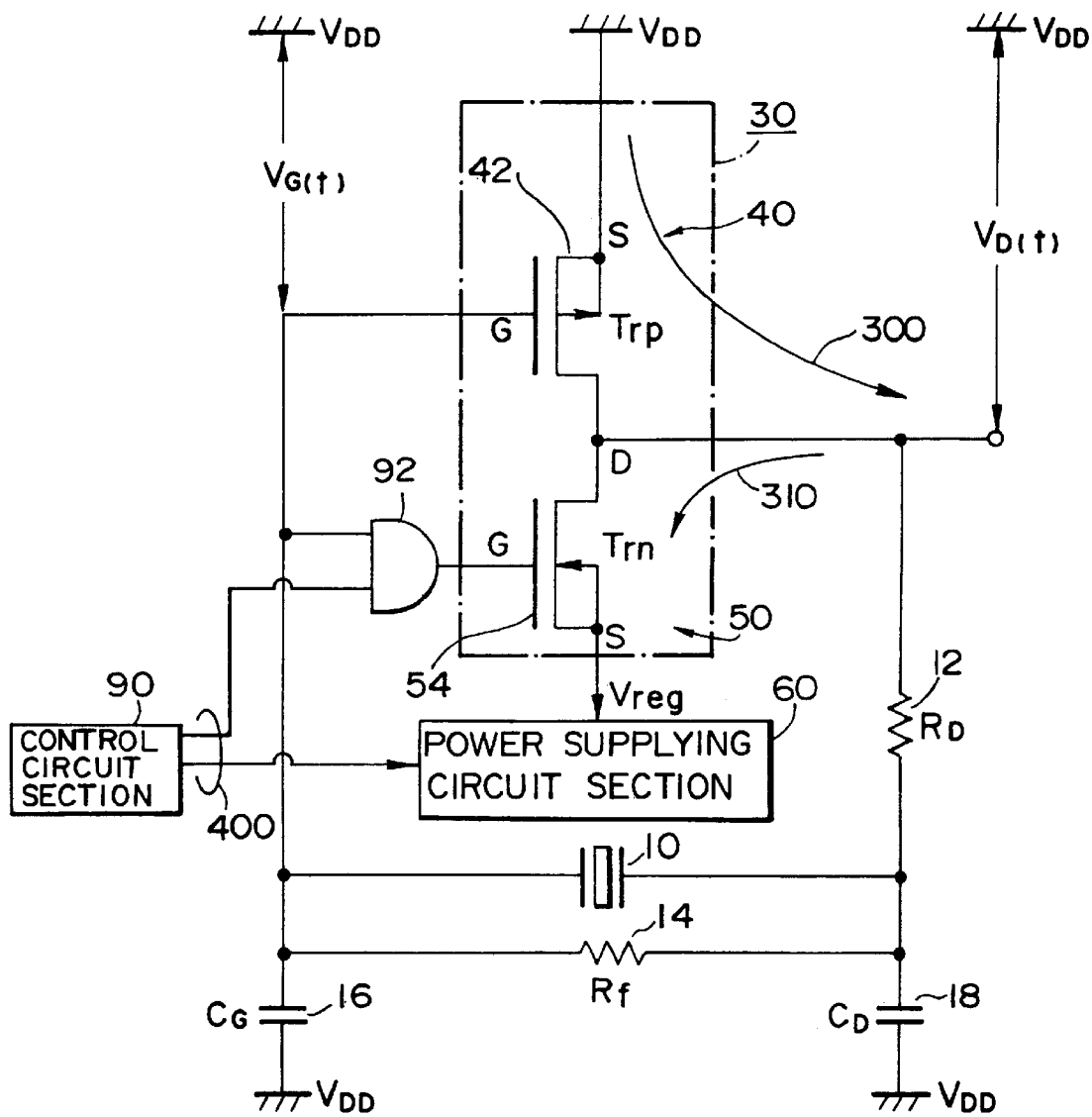
FIG. 12 is a circuit diagram of yet another crystal oscillation circuit.

Another embodiment of the crystal oscillation circuit is shown in FIG. 12. Note that components that correspond to those in FIG. 9 are given the same reference numbers in this figure and further description thereof is omitted.

This embodiment is characterized in that the current-limiting element 94 that configures the second circuit 50 of FIG. 9 is replaced by a field-effect transistor 54.

In this embodiment, a field-effect transistor which has n-type conductivity and is also a depletion-mode transistor is used as this field-effect transistor 54. The use of a depletion-mode field-effect transistor makes it possible for a current to flow to a certain extent between the drain and the source thereof, even when the transistor 54 is controlled to be off, and, as a result, this transistor 54 can be made to function as a current-limiting element that limits the current flowing therethrough.

The source of the transistor 54 is connected to the power voltage $V_{reg}$ side of the power supplying circuit section 60 and the drain thereof is connected to the output terminal 79 of the oscillation circuit (in this case, it is actually connected to the drain of the other transistor 42). The fed-back gate signal $V_{G(t)}$ and a control signal 400 supplied from a control circuit section 90 are both input to the gate of the transistor 54 through an AND gate 92.

Figure 13:
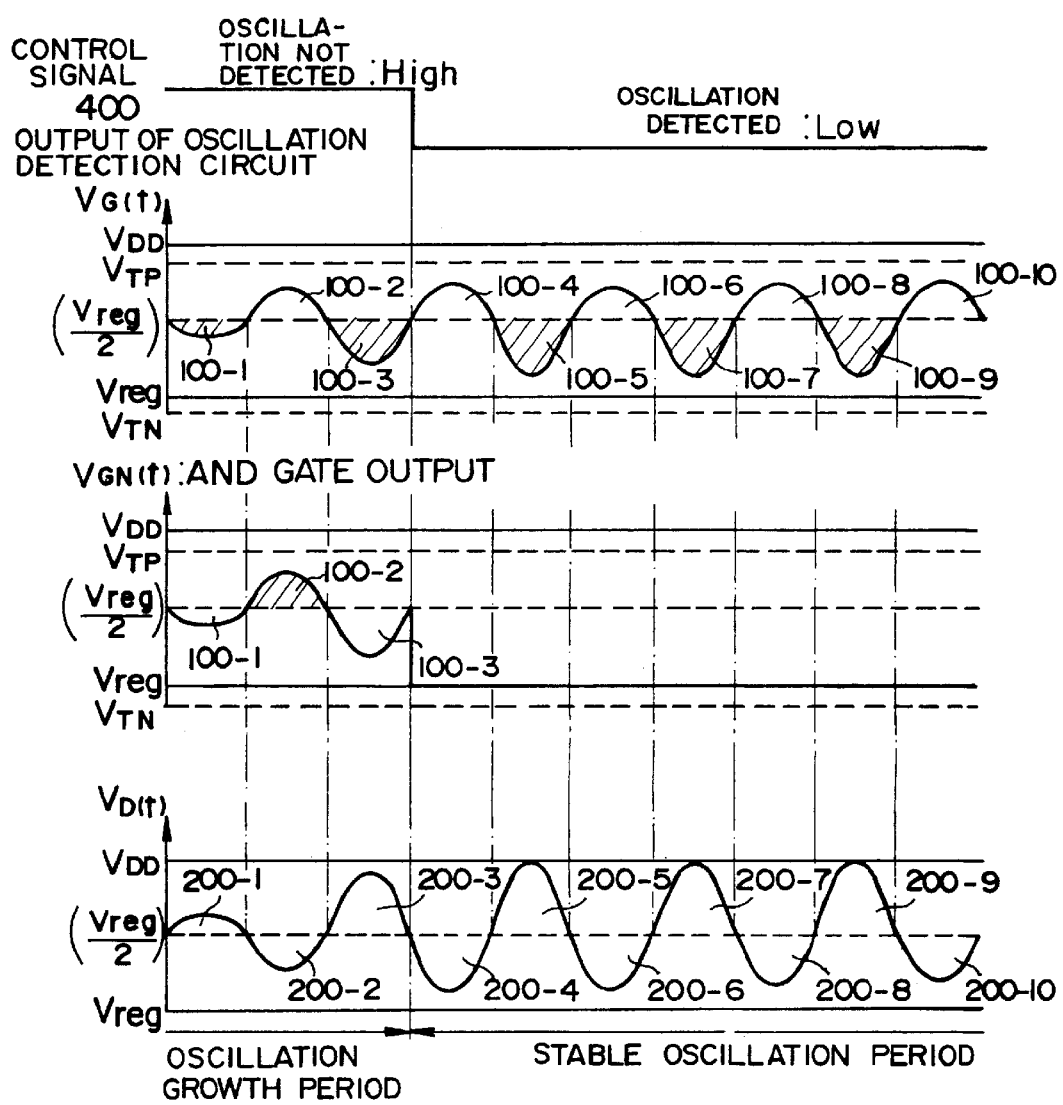
FIG. 13 is a timing chart of the circuit of FIG. 12.

A timing chart of the crystal oscillation circuit of this embodiment is shown in FIG. 13. In this figure, $V_{GN(t)}$ represents a gate voltage applied to the gate of the transistor 54 from the AND gate 92.

In this embodiment, the control circuit section 90 detects whether or not the crystal oscillation circuit has reached a stable oscillation state after the power voltage $V_{reg}$ has been applied to the crystal oscillation circuit.

The control circuit section 90 outputs a high-level control signal 400 to the AND gate 92 from the time that the power voltage is applied until the oscillation stable state is achieved, then the control signal 400 switches from high to low after the oscillation has stabilized.

This ensures that the gate signal $V_{G(t)}$ that is fed back and input to the gate of the transistor 54 is applied thereto without modification during the time that the control signal 400 is high, the two transistors 42 and 54 configuring the inverting amplifier 30 are alternately turned on and off by this gate signal $V_{G(t)}$, and thus the oscillation circuit can rise rapidly to a stable oscillation state.

When the oscillation has stabilized, the level of the control signal 400 is switched to low so that the transistor 54 is forcibly controlled to stay off and the remaining transistor 42 alone is turned on and off, in the same way as in the embodiment of FIG. 9. During this time, since a depletion-mode transistor is used for the transistor 54 that is turned off, as described previously, the value of the discharging current in the discharging cycles of the crystal oscillator 10 can be greatly limited, making it possible to cut greatly the power consumption of the entire circuit.

This depletion-mode transistor 54 is also called a normally-on transistor because a drain current can still flow even when the voltage between the source and gate thereof is zero. For that reason, the value of the power voltage $V_{reg}$ necessary for driving the inverting amplifier 30 stably can be set to that for the enhancement-mode field-effect transistor 42 alone, so that the value of the power voltage $V_{reg}$ can be greatly reduced in comparison to the configuration in which both of the transistors 42 and 54 are enhancement-mode transistors, and this aspect can also help cut the power consumption.

In this manner, the crystal oscillation circuit of this embodiment can achieve stable oscillation within a short time, and can also make it possible to dramatically cut the power consumption when it is oscillating stably.

In this embodiment, the transistor 54 that functions as a current-limiting element is used actively only when the circuit is activated, and it becomes unnecessary for the oscillation operation once the oscillation is stable. This means that the capabilities of the transistor 54 can be made less that those of the other transistor 42, which is extremely effective from the circuit configuration viewpoint.

The circuit of this embodiment is configured by using transistors of differing conductivity types as the field-effect transistors 42 and 54 of the first and second circuits 40 and 50, but the circuit could equally well be configured so that transistors of the same conductive type (for example, p-type) are used for the field-effect transistors 42 and 54 of the first and second circuits 40 and 50.

Figure 16:
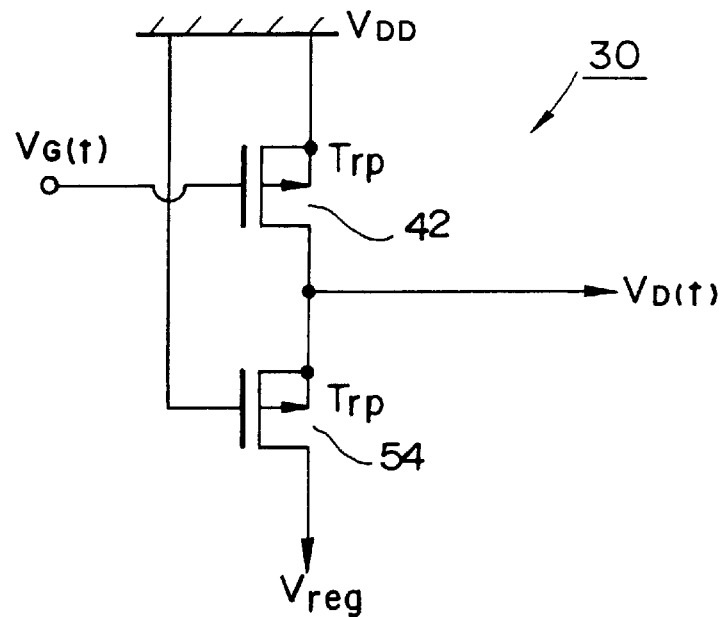
FIG. 16 is a circuit diagram of a variation on the inverting amplifier in the crystal oscillation circuit of FIG. 12.
Figure 17:
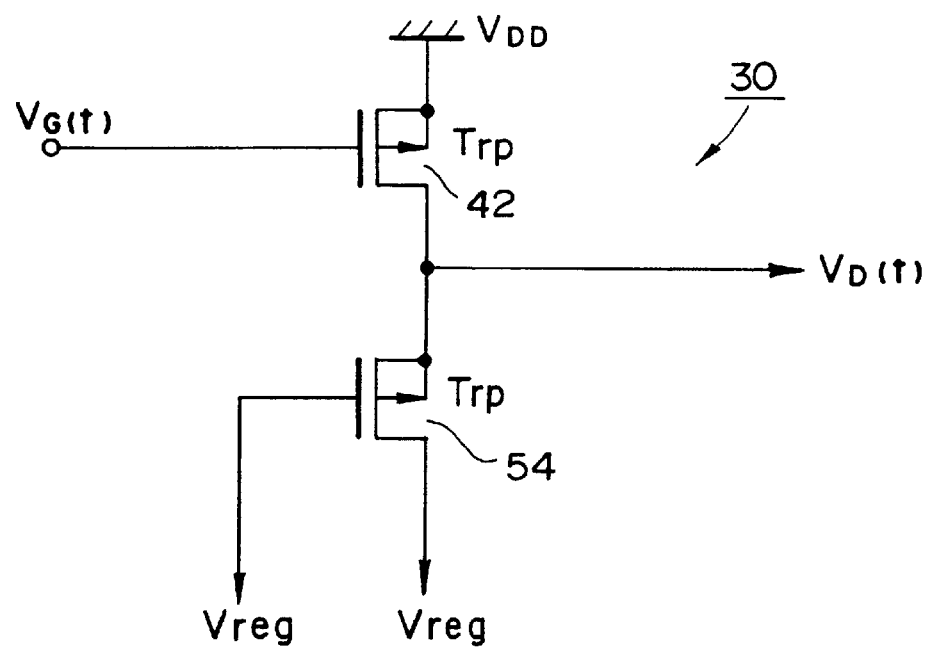
FIG. 17 is a circuit diagram of another variation on the inverting amplifier in the crystal oscillation circuit of FIG. 12.

Specific examples of circuit configurations in which the transistors 42 and 54 are p-type transistors are shown in FIGS. 16 and 17. The inverting amplifier 30 shown in FIG. 16 is configured in such a manner that the transistor 42 is an enhancement-mode field-effect transistor, the transistor 54 is a depletion-mode field-effect transistor, and the gate of the depletion-mode field-effect transistor 54 that functions as a current-limiting element is connected to the ground $V_{DD}$ side.

This configuration ensures that the field-effect transistor 54 of FIG. 16 functions in a similar manner to the field-effect transistor 54 of FIG. 12, making it possible to effectively limit the discharging current from the crystal oscillator 10.

The inverting amplifier 30 shown in FIG. 17 uses p-type enhancement-mode field-effect transistors for both of the transistors 42 and 54. The gate of the transistor 54 that functions as a current-limiting element is connected to the power source $V_{reg}$ side. This circuit configuration ensures that the transistor 54 is always on but, if a high-impedance element is used for this always-on transistor 54, the transistor 54 can function as a current-limiting element to limit the discharging current from the crystal oscillator 10.

The embodiments of the crystal oscillation circuit shown in FIGS. 9 and 12 were described as using a power voltage $V_{reg}$ that is constant, by way of example, but a configuration that switches between a large value of $V_{reg}$ during the oscillation growth period $T_1$ and a small value of $V_{reg}$ during the stable oscillation period $T_2$ could also be used therefor. This makes it possible to achieve stable oscillation quickly, while enabling a cut in power consumption after the oscillation has stabilized.

Figure 11:
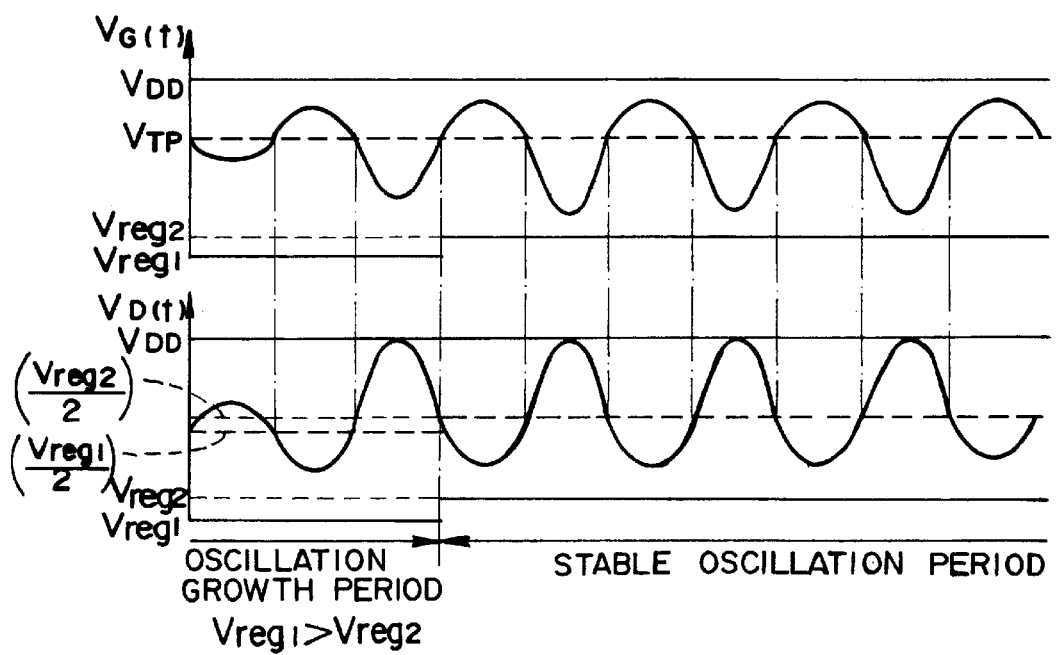
FIG. 11 is a timing chart of a variation.
Figure 14:
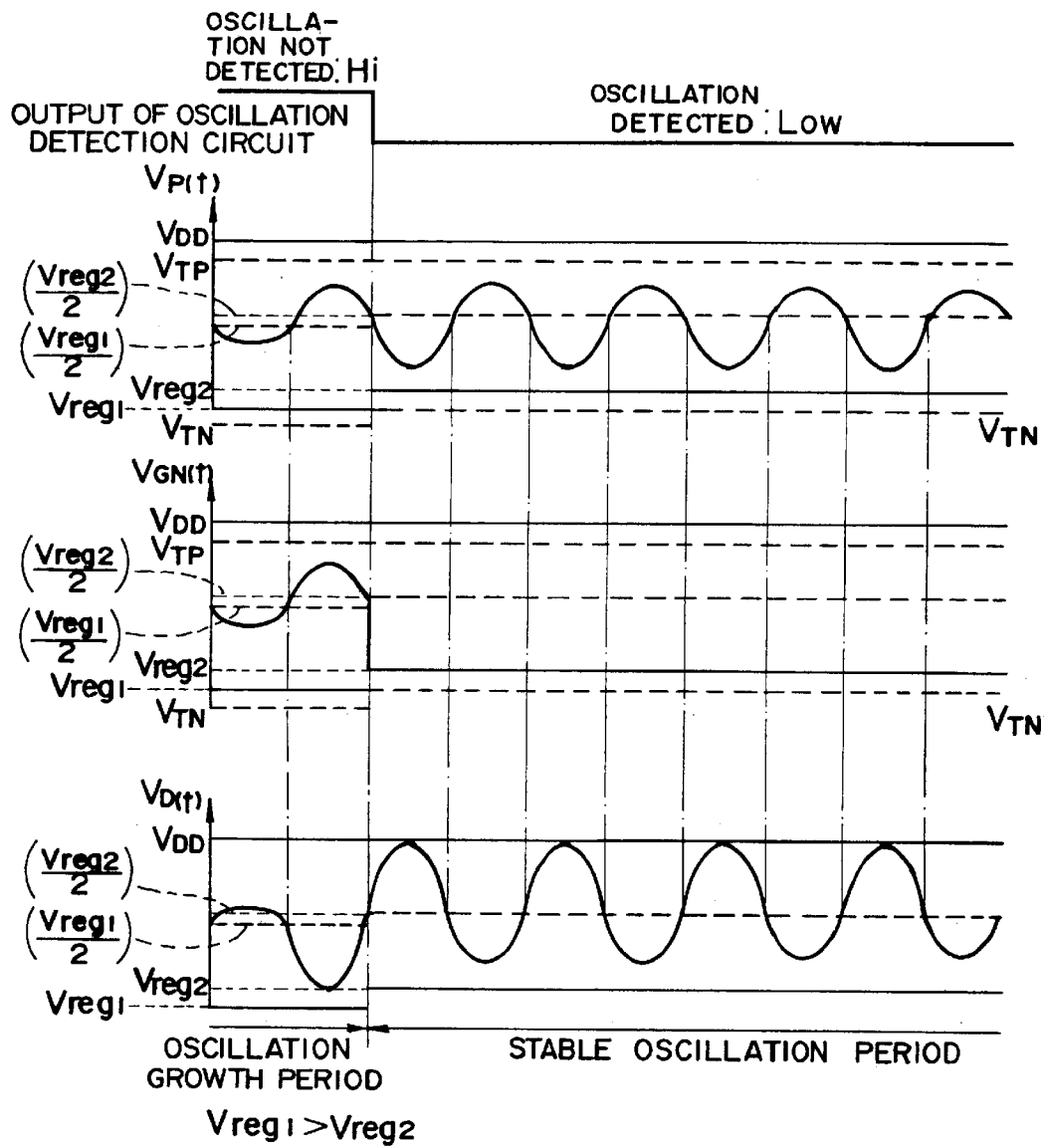
FIG. 14 is a timing chart of a variation.

In other words, the power supplying circuit section 60 in each of the crystal oscillation circuits of the embodiments shown in FIGS. 9 and 12 is configured to switch between outputting a first power voltage $V_{reg1}$ for activation and a second power voltage $V_{reg2}$ for stable drive, as shown in FIGS. 11 and 14. In such a case, the absolute value of the first power voltage $V_{reg1}$ is set to be greater than the absolute value of the second power voltage $V_{reg2}$, so that the inverting amplifier 30 can be driven by a large power supply when the circuit is activated.

The control circuit section 90 outputs the control signal 400 to the power supplying circuit section 60 to control the power supplying circuit section 60 in such a manner that it outputs the first power voltage $V_{reg1}$ when the circuit is activated and the second power voltage $V_{reg2}$ when the oscillation has stabilized.

This makes it possible to greatly shorten the oscillation growth period $T_1$, in comparison with oscillation circuits that are driven continuously at the same power voltage, thus enabling rapid establishment of the oscillation circuit.

Note that various other embodiments of the present invention can be envisioned, in addition to the embodiments of FIGS. 9 and 12.

For example, the second embodiment shown in FIG. 12 was described as using a depletion-mode transistor as the transistor 54, by way of example, but this embodiment is not limited thereto and it can equally well use any other type of transistor, such as an enhancement-mode transistor. In such a case, the discharging current denoted by 310 from the crystal oscillator 10 is completely cut while the transistor is controlled to be off, and this portion acts as a brake on the oscillation. However, a certain amount of leakage is possible from the crystal oscillator 10 itself and from the discharging circuit through the resistor 14, and moreover the crystal oscillator 10 will continue to oscillate naturally due to inertia, so that the oscillation of the crystal oscillator 10 can be maintained thereby. In other words, the efficiency will drop to a certain extent in comparison to a the case in which the transistor 54 is a depletion-mode transistor, but the power consumption is still less than it is in the prior art and in addition a stable oscillation state can be maintained.

The first and second circuits 40 and 50 that form the inverting amplifier 30 were described above as using the transistor 42 and a first current-limiting element, respectively, by way of example, but other circuit elements can also be combined therein to configure these circuits if necessary, without any loss of function of the first and second circuits 40 and 50.

The descriptions of the above embodiments also took the use of the crystal oscillation circuit of this invention in an electronic circuit for a timepiece, by way of example, but the present invention is not limited thereto and is extremely effective when used a wide range of portable electronic equipment that have restricted power source capacities, such as portable telephones, portable computer terminals, or any other type of portable equipment.

The embodiments have been described as to the crystal oscillation circuit having the crystal oscillator as a source of oscillation. The present invention may be applied similarly to a drive circuit (or driver) such as a piezoelectric motor which uses a piezoelectric element as an oscillator.

What is claimed is:

1. An oscillation circuit comprising:
   an inverting amplifier including a first semiconductor switching element and a second semiconductor switching element;
   wherein said first and second semiconductor switching elements are prevented from being on simultaneously to limit a short-circuiting current flowing through said inverting amplifier when said oscillation circuit is driven, and
   wherein a sum of an absolute value of a threshold voltage of said first semiconductor switching element and an absolute value of a threshold voltage of said second semiconductor switching element is set to be greater than or equal to an absolute value of a power voltage of said inverting amplifier, to limit a short-circuiting current flowing through said inverting amplifier.

2. The oscillation circuit as defined in claim 1,
   further comprising a feedback circuit having a crystal oscillator connected between an output side and an input side of said inverting amplifier, for causing a phase of an output signal from said inverting amplifier to invert and feeding the inverted signal back to said inverting amplifier as an input;
   wherein said inverting amplifier comprises a first circuit including said first semiconductor switching element, and a second circuit including said second semiconductor switching element;
   wherein said first semiconductor switching element is connected to a side of a first potential and is driven to be turned on and off by said feedback input, to excite said crystal oscillator;
   wherein said second semiconductor switching element is connected to a side of a second potential that differs from said first potential and is driven to be turned on and off by said feedback input at a timing that differs from that of said first semiconductor switching element, to excite said crystal oscillator.

3. The oscillation circuit as defined in claim 1 wherein an OFF region in which said first and second semiconductor switching elements are turned off so that they are prevented from being on simultaneously includes a sub-threshold region in which a sub-threshold current flows.

4. The oscillation circuit as defined in claim 1 wherein the sum of the absolute values of the threshold voltages of said first and second semiconductor switching elements is set to be greater than or equal to the absolute value of the power voltage of said inverting amplifier to satisfy the following formula $$|V_{reg}| \leq |V1| + |V2|$$

where the absolute value of the threshold voltage of said first semiconductor switching element is $|V1|$; the absolute value of the threshold voltage of said second semiconductor switching element is $|V2|$; and the absolute value of the power voltage of the inverting amplifier is $|V_{reg}|$, and wherein the absolute values of the threshold voltages of said first and second semiconductor switching elements are set to be smaller than the absolute value of the power voltage of said inverting amplifier as represented by the following formulae $|V_{reg}|>|V1|$ and $|V_{reg}|>|V2|$.

5. The oscillation circuit as defined in claim 1, further comprising a source of constant current being connected in parallel to at least one of said first and second semiconductor switching elements, wherein a shortage of power necessary for stabilizing oscillation is offset by power from said source.

6. The oscillation circuit as defined in claim 5 wherein the absolute value of the power voltage of the inverting amplifier is set to be equal to a minimum value of power necessary for stabilizing oscillation.

7. The oscillation circuit as defined in claim 1, further comprising constant current sources connected in parallel with at least one of said first and second semiconductor switching elements, each constant current source supplying a different constant current, and a selection circuit for selecting a constant current source from said constant current sources, wherein a shortage of power necessary for stabilizing oscillation is offset by power from said selected source.

8. The oscillation circuit as defined in claim 7 wherein the absolute value of the power voltage of the inverting amplifier is set to be equal to a minimum value of power necessary for stabilizing oscillation.

9. The oscillation circuit as defined in claim 7 wherein a target absolute value of the power voltage of said inverting amplifier is set to be between an absolute value of a minimum power voltage of said inverting amplifier necessary for stabilizing oscillation and an absolute value of a first power voltage that is smaller than the absolute value of said minimum power voltage by a range of fluctuations of power voltages of inverting amplifiers in oscillation circuits which are produced in large quantities and wherein said selection circuit selects a constant current based on power voltages of inverting amplifiers in oscillation circuits which are produced in large quantities, and a shortage of power necessary for stabilizing oscillation is offset by power from said selected source.

10. The oscillation circuit as defined in claim 7 wherein said constant current sources comprise a plurality of constant current sources connected in parallel to said first semiconductor switching element, each of said plurality of constant current sources supplying a different constant current and another plurality of constant current sources connected in parallel to said second semiconductor switching element, each of said another plurality of constant current sources supplying a different constant current and wherein said selection circuit selects a constant current source from said pluralities of constant current sources, and a shortage of power necessary for stabilizing oscillation is offset by power from said selected source.

11. The oscillation circuit as defined in claim 1, further comprising a power supply circuit for selectively outputting at least two types of power voltages $V_{reg}$, one having a large absolute value for initiating oscillation and the other having a small absolute value for stabilizing oscillation and wherein the power voltage having said large absolute value for initiating oscillation is supplied to said inverting amplifier during a period of time between turning power on and stabilizing oscillation while the other power voltage having said small absolute value for stabilizing oscillation is supplied to said inverting amplifier during a period of time between stabilizing oscillation and terminating oscillation.

12. The oscillation circuit as defined in claim 11, further comprising a voltage control circuit for controlling said power supply circuit to output the power voltage having the large absolute value for initiating oscillation when a period of time between turning power on and stabilizing oscillation is detected, for controlling said power supply circuit to output the other power voltage having the small absolute value for stabilizing oscillation when a transition from turning power on to stabilizing oscillation is detected.

13. The oscillation circuit as defined in claim 12 wherein said voltage control circuit comprises a power-on detecting circuit for detecting a power on of said oscillation circuit and a timer for detecting a transition from turning power on to stabilizing oscillation by measuring time passed since power is turned on, for controlling said power supply circuit to output the power voltage having the large absolute value for initiating oscillation at a time said power is turned on and for controlling said power supply circuit to output the other power voltage having the small absolute value for stabilizing oscillation when said timer detects a transition from turning power on to stabilizing oscillation.

14. The oscillation circuit as defined in claim 1 wherein said inverting amplifier comprises a first inverting amplifier for initiating oscillation and a second inverting amplifier for stabilizing oscillation and wherein said first inverting amplifier provides oscillation during a period of time between turning power on and stabilizing oscillation while said second inverting amplifier provides oscillation during a period of time between stabilizing oscillation and terminating oscillation.

15. The oscillation circuit as defined in claim 14, further comprising an inverting-amplifier switching circuit for selecting said first inverting amplifier when a period of time between turning power on and stabilizing oscillation is detected and for selecting said second inverting amplifier after a transition from turning power on to stabilizing oscillation.

16. The oscillation circuit as defined in claim 15 wherein said inverting-amplifier switching circuit comprises a power-on detecting circuit for detecting a power on of said oscillation circuit and a timer for detecting a transition from turning power on to stabilizing oscillation by measuring time passed since power is turned on and wherein said first inverting amplifier is selected at a time power is turned on while said second inverting amplifier is selected when said timer detects a transition from turning power on to stabilizing oscillation.

17. The oscillation circuit as defined in claim 14 wherein an absolute value of a threshold voltage of a semiconductor switching element that constitutes said first inverting amplifier is set to be smaller than an absolute value of a threshold voltage of a semiconductor switching element that constitutes said second inverting amplifier.

18. The oscillation circuit as defined in claim 1 wherein said oscillation circuit uses a crystal oscillator having a high value of Q, the value Q being an index representing a degree of easiness in mechanical oscillation.

19. The oscillation circuit as defined in claim 18 wherein said value Q is equal to or higher than 10,000 and is represented by the following $Q=\alpha/Rxt$ where Rxt is a component of resistance in the crystal oscillator and $\alpha$ is a coefficient.

20. An oscillation circuit comprising:
an inverting amplifier including a first semiconductor switching element and a second semiconductor switching element, said first and second semiconductor switching elements being prevented from being on simultaneously to limit a short-circuiting current flowing through said inverting amplifier when said oscillation circuit is driven; and
a bias circuit for applying a first direct current bias voltage and a second direct current bias voltage to gates of said first semiconductor switching element and said second semiconductor switching element, respectively;
said first and second direct current bias voltages shifting values of the direct current potentials of feedback inputs that are input from said inverting amplifier to said gates of said first and second semiconductor switching elements, to prevent said first and second semiconductor switching elements from being on simultaneously.

21. An oscillation circuit comprising:
an inverting amplifier including a first semiconductor switching element and a second semiconductor switching element, said first and second semiconductor switching elements being prevented from being on simultaneously to limit a short-circuiting current flowing through said inverting amplifier when said oscillation circuit is driven;
a feedback circuit having a crystal oscillator connected between an output side and an input side of said inverting amplifier, for causing a phase of an output signal from said inverting amplifier to invert and feeding the inverted signal back to said inverting amplifier as an input; and
a bias circuit for applying a direct current bias voltage to said inverting amplifier;
wherein said inverting amplifier comprises:
 a first circuit being connected to a side of a first potential and including said first semiconductor switching element; and
 a second circuit being connected to a side of a second potential that differs from said first potential and including said second semiconductor switching element;
wherein said first semiconductor switching element is connected to a side of said first potential and is driven to be turned on and off by said feedback input that is input to a gate, to excite said crystal oscillator;
wherein said second semiconductor switching element is connected to a side of said second potential and is driven to be turned on and off by said feedback input that is input to a gate at a timing that differs from that of said first semiconductor switching element, to excite said crystal oscillator;
wherein said bias circuit comprises:
 a first bias circuit for applying a first direct current bias voltage to a gate of said first semiconductor switching element; and
 a second bias circuit for applying a second direct current bias voltage to a gate of said second semiconductor switching element; and
 wherein said first and second direct current bias voltages shift values of the direct current potentials of feedback inputs that are input from said inverting amplifier to said gates of said first and second semiconductor switching elements, to prevent said first and second semiconductor switching elements from being on simultaneously.

22. The oscillation circuit as defined in claim 21 wherein said first direct current bias voltage is set to said first potential and wherein said second direct current bias voltage is set to said second potential.

23. The oscillation circuit as defined in claim 1 wherein said first and second semiconductor switching elements are configured by using field-effect transistor elements of differing conductivity types.

24. The oscillation circuit as defined in claim 20 wherein an OFF region in which said first and second semiconductor switching elements are turned off so that they are prevented from being on simultaneously includes a sub-threshold region in which a sub-threshold current flows.

25. The oscillation circuit as defined in claim 20 wherein said first and second semiconductor switching elements are configured by using field-effect transistor elements of differing conductivity types.

26. The oscillation circuit as defined in claim 20, further comprising a source of constant current being connected in parallel to at least one of said first and second semiconductor switching elements, wherein a shortage of power necessary for stabilizing oscillation is offset by power from said source.

27. The oscillation circuit as defined in claim 26 wherein an absolute value of a power voltage of the inverting amplifier is set to be equal to a minimum value of power necessary for stabilizing oscillation.

28. The oscillation circuit as defined in claim 20 further comprising constant current sources being connected in parallel to at least one of said first and second semiconductor switching elements, each constant current source supplying a different constant current, and a selection circuit for selecting a constant current source from said constant current sources, wherein a shortage of power necessary for stabilizing oscillation is offset by power from said selected source.

29. The oscillation circuit as defined in claim 28 wherein an absolute value of a power voltage of the inverting amplifier is set to be equal to a minimum value of power necessary for stabilizing oscillation.

30. The oscillation circuit as defined in claim 28 wherein an absolute value of a target power voltage of said inverting amplifier is set to be between an absolute value of a minimum power voltage of said inverting amplifier necessary for stabilizing oscillation and an absolute value of a first power voltage that is smaller than the absolute value of said minimum power voltage by a range of fluctuations of power voltages of inverting amplifiers in oscillation circuits which are produced in large quantities and wherein said selection circuit selects a constant current based on power voltages of inverting amplifiers in oscillation circuits which are produced in large quantities, and a shortage of power necessary for stabilizing oscillation is offset by power from said selected source.

31. The oscillation circuit as defined in claim 28 wherein said constant current sources comprise a plurality of constant current sources connected in parallel to said first semiconductor switching element, each of said plurality of constant current sources supplying a different constant current and another plurality of constant current sources connected in parallel to said second semiconductor switching element, each of said another plurality of constant current sources supplying a different constant current and wherein said selection circuit selects a constant current source from said pluralities of constant current sources, and a shortage of power necessary for stabilizing oscillation is offset by power from said selected source.

32. The oscillation circuit as defined in claim 20, further comprising a power supply circuit for outputting at least two types of power voltages $V_{reg}$, one having a large absolute value for initiating oscillation and the other having a small absolute value for stabilizing oscillation and wherein the power voltage having said large absolute value for initiating oscillation is supplied to said inverting amplifier during a period of time between turning power on and stabilizing oscillation while the other power voltage having said small absolute value for stabilizing oscillation is supplied to said inverting amplifier during a period of time between stabilizing oscillation and terminating oscillation.

33. The oscillation circuit as defined in claim 32, further comprising a voltage control circuit for controlling said power supply circuit to output the power voltage having the large absolute value for initiating oscillation when a period of time between turning power on and stabilizing oscillation is detected and for controlling said power supply circuit to output the other power voltage having the small absolute value for stabilizing oscillation when a transition from turning power on to stabilizing oscillation is detected.

34. The oscillation circuit as defined in claim 33 wherein said voltage control circuit comprises a power-on detecting circuit for detecting a power on of said oscillation circuit and a timer for detecting a transition from turning power on to stabilizing oscillation by measuring time passed since power is turned on and for controlling said power supply circuit to output the power voltage having the large absolute value for initiating oscillation at a time said power is turned on and for controlling said power supply circuit to output the other power voltage having the small absolute value for stabilizing oscillation when said timer detects a transition from turning power on to the stabilizing oscillation.

35. The oscillation circuit as defined in claim 20 wherein said inverting amplifier comprises a first inverting amplifier for initiating oscillation and a second inverting amplifier for stabilizing oscillation and wherein said first inverting amplifier provides oscillation during a period of time between turning power on and stabilizing oscillation while said second inverting amplifier provides oscillation during a period of time between stabilizing oscillation and terminating oscillation.

36. The oscillation circuit as defined in claim 35, further comprising an inverting-amplifier switching circuit for selecting said first inverting amplifier when a period of time between turning power on and stabilizing oscillation is detected and for selecting said second inverting amplifier after a transition from turning power on to stabilizing oscillation.

37. The oscillation circuit as defined in claim 36 wherein said inverting-amplifier switching circuit comprises a power-on detecting circuit for detecting a power on of said oscillation circuit and a timer for detecting a transition from turning power on to stabilizing oscillation by measuring time passed since power is turned on and wherein said first inverting amplifier is selected when said power is turned on while said second inverting amplifier is selected when said timer detects a transition from turning power on to stabilizing oscillation.

38. The oscillation circuit as defined in claim 35 wherein an absolute value of a threshold voltage of a semiconductor switching element that constitutes said first inverting amplifier is set to be smaller than an absolute value of a threshold voltage of a semiconductor switching element that constitutes said second inverting amplifier.

39. The oscillation circuit as defined in claim 20 wherein said oscillation circuit uses a crystal oscillator having a high value of Q, the value Q being an index representing the degree of easiness in mechanical oscillation.

40. The oscillation circuit as defined in claim 39 wherein said value Q is equal to or higher than 10,000 and represented by the following $$Q = \alpha / Rxt$$

where Rxt is a component of resistance in the crystal oscillator and $\alpha$ is a coefficient.

41. The oscillation circuit as defined in claim 1 wherein a threshold voltage $V_T$ of each of said first and second semiconductor switching elements that functions as a gate voltage for inverting a conduction type of a silicon crystal surface is represented by the following $$V_T = 2\phi_E + [2 \cdot \in_S \cdot q\, N_A \cdot (2\phi_E)]^{1/2} / (\in_S / d)$$

where $\in_E$ is a Fermi potential, $\in_S$ is $\in$ Si (a relative dielectric constant of silicon) multiplied by $\in 0$ (a dielectric constant of vacuum), q is an electron charge, $N_A$ is a concentration of a substrate and d is a thickness of an oxide film.

42. An electronic circuit comprising the oscillation circuit as defined in claim 1.

43. A semiconductor device comprising the oscillation circuit as defined in claim 1.

44. An electronic equipment comprising the oscillation circuit as defined in claim 1.

45. A timepiece comprising the oscillation circuit as defined in claim 1.

* * * * *